United States Patent
Alsaleem

(10) Patent No.: US 10,670,488 B2
(45) Date of Patent: Jun. 2, 2020

(54) CURRENT BASED AIR FILTER DIAGNOSTICS AND MONITORING

(71) Applicant: EMERSON CLIMATE TECHNOLOGIES, INC., Sidney, OH (US)

(72) Inventor: Fadi M. Alsaleem, Troy, OH (US)

(73) Assignee: Emerson Climate Technologies, Inc., Sidney, OH (US)

( * ) Notice: Subject to any disclaimer, the term of this patent is extended or adjusted under 35 U.S.C. 154(b) by 782 days.

(21) Appl. No.: 14/709,658

(22) Filed: May 12, 2015

(65) Prior Publication Data

US 2015/0330861 A1 Nov. 19, 2015

Related U.S. Application Data

(60) Provisional application No. 61/993,527, filed on May 15, 2014.

(51) Int. Cl.
*F24F 11/30* (2018.01)
*G01R 31/34* (2020.01)
(Continued)

(52) U.S. Cl.
CPC ............. *G01M 3/025* (2013.01); *F04B 51/00* (2013.01); *F24F 11/30* (2018.01); *F24F 11/32* (2018.01);
(Continued)

(58) Field of Classification Search
CPC ....... G01M 3/025; F24F 11/30; G01R 31/343; G01R 31/34; G01R 19/0092; G01R 31/2825; F04B 51/00
See application file for complete search history.

(56) References Cited

U.S. PATENT DOCUMENTS 6,385,510 B1    5/2002   Hoog et al.
9,188,508 B1 *  11/2015  Meyer ................. G01M 99/005
(Continued)

FOREIGN PATENT DOCUMENTS

CN      201096741 Y     8/2008
CN      103597292 A     2/2014
WO      WO-2012118830 A2  9/2012

OTHER PUBLICATIONS

HVAC-Talk.com, <https://hvac-talk.com/vbb/showthread.php?403522-Does-a-blower-motor-with-a-dirty-filte> and <https://www.contractingbusiness.com/about-us> retrieved on Mar. 14, 2019. (Year: 2009).*

(Continued)

*Primary Examiner* — Alexander Satanovsky
*Assistant Examiner* — Mark I Crohn
(74) *Attorney, Agent, or Firm* — Harness, Dickey & Pierce, P.L.C.

(57) ABSTRACT

A system and method for a heating, ventilation, and air conditioning (HVAC) system of a building is provided. A monitoring device installed at the building is configured to measure a current supplied to the HVAC system and transmit current data based on the measured current. The monitoring system includes a monitoring server, located remotely from the building, configured to receive the transmitted current data and, based on the received current data, determine an average motor current over a predetermined time period and determine whether a failure has occurred in an air filter of the HVAC system based on a comparison of the average motor current with a predetermined threshold. The monitoring server generates a notification based on the comparison indicating that the failure has occurred in the air filter.

20 Claims, 12 Drawing Sheets

(51) Int. Cl.
G01M 3/02 (2006.01)
G01R 19/00 (2006.01)
F04B 51/00 (2006.01)
F24F 11/32 (2018.01)
F24F 11/62 (2018.01)
G01R 31/28 (2006.01)

(52) U.S. Cl.
CPC .......... *F24F 11/62* (2018.01); *G01R 19/0092* (2013.01); *G01R 31/34* (2013.01); *G01R 31/343* (2013.01); *G01R 31/2825* (2013.01)

(56) References Cited

U.S. PATENT DOCUMENTS

| | | | |
|---|---|---|---|
| 2002/0019725 A1 | 2/2002 | Petite | |
| 2003/0070544 A1* | 4/2003 | Mulvaney | B01D 46/0086 95/25 |
| 2004/0113803 A1* | 6/2004 | Keown | B01D 35/143 340/648 |
| 2007/0012052 A1 | 1/2007 | Butler et al. | |
| 2012/0212166 A1* | 8/2012 | Merkel | F24F 11/0079 318/400.08 |
| 2012/0221150 A1* | 8/2012 | Arensmeier | G05B 23/0224 700/276 |
| 2014/0074730 A1* | 3/2014 | Arensmeier | G06Q 10/20 705/305 |
| 2014/0262134 A1 | 9/2014 | Arensmeier et al. | |

OTHER PUBLICATIONS

York Central Tech Talk, "An ECM motor is some times [sic] referred to an a [sic] variable speed motor," <https://yorkcentraltechtalk.wordpress.com/2012/09/11/what-is-an-ecm-motor/>, dated Sep. 11, 2012 (Year: 2012).*

Search Report regarding European Patent Application No. 15793371.4, dated Nov. 15, 2017.

Office Action regarding Canadian Patent Application No. 2,948,545, dated Aug. 8, 2017.

International Search Report regarding International Application No. PCT/US2015/030843, dated Aug. 18, 2015.

Written Opinion from the International Searching Auhority regarding International Application No. PCT/US2015/030843, dated Aug. 18, 2015.

Office Action regarding Australian Patent Application No. 2015259101, dated Jun. 29, 2017.

Office Action regarding Australian Patent Application No. 2015259101, dated Feb. 23, 2018.

Office Action regarding European Patent Application No. 15 793 371.4-1022, dated May 8, 2018.

Office Action regarding Canadian Patent Application No. 2,948,545, dated Jun. 1, 2018.

Office Action regarding Chinese Patent Application No. 201580037953.8, dated Aug. 1, 2018.

Office Action regarding Chinese Patent Application No. 201580037953.8, dated Mar. 12, 2019.

Non-Final Office Action regarding U.S. Appl. No. 14/709,658 dated Mar. 20, 2019.

Office Action regarding Canadian Patent Application No. 2,948,545 dated Apr. 30, 2019.

"Comparing Motor Technologies," Michael Brian, Air Conditioning, Heating & Refrigeration News (ACHRNews), Dec. 14, 2009, retrieved from https://www.achrnews.com/articles/112674-comparing-motor-technologies on Apr. 20, 2019 (Apr. 20, 2019).

Decision of Rejection issued by China National Intellectual Property Administration dated Sep. 27, 2019 regarding Chinese Patent Application for Invention No. 201580037953.8, with English translation provided by Unitalen Attorneys at Law.

* cited by examiner

CURRENT BASED AIR FILTER DIAGNOSTICS AND MONITORING

CROSS-REFERENCE TO RELATED APPLICATIONS

This application claims the benefit of U.S. Provisional Application No. 61/993,527, filed on May 15, 2014. The entire disclosure of the above application is incorporated herein by reference.

FIELD

The present disclosure relates to environmental comfort systems and more particularly to remote monitoring and diagnosis of residential and light commercial environmental comfort systems.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A residential or light commercial HVAC (heating, ventilation, or air conditioning) system controls environmental parameters, such as temperature and humidity, of a building. The target values for the environmental parameters, such as a temperature set point, may be specified by a user, occupant, or owner of the building, such as an employee working in the building or a homeowner.

In FIG. 1, a block diagram of an example HVAC system is presented. In this particular example, a forced air system with a gas furnace is shown. Return air is pulled from the building through a filter 104 by a circulator blower 108. The circulator blower 108, also referred to as a fan, is controlled by a control module 112. The control module 112 receives signals from a thermostat 116. For example only, the thermostat 116 may include one or more temperature set points specified by the user.

The thermostat 116 may direct that the circulator blower 108 be turned on at all times or only when a heat request or cool request is present (automatic fan mode). In various implementations, the circulator blower 108 can operate at multiple speeds or at any speed within a predetermined range. One or more switching relays (not shown) may be used to control the circulator blower 108 and/or to select a speed of the circulator blower 108.

The thermostat 116 provides the heat and/or cool requests to the control module 112. When a heat request is made, the control module 112 causes a burner 120 to ignite. Heat from combustion is introduced to the return air provided by the circulator blower 108 in a heat exchanger 124. The heated air is supplied to the building and is referred to as supply air.

The burner 120 may include a pilot light, which is a small constant flame for igniting the primary flame in the burner 120. Alternatively, an intermittent pilot may be used in which a small flame is first lit prior to igniting the primary flame in the burner 120. A sparker may be used for an intermittent pilot implementation or for direct burner ignition. Another ignition option includes a hot surface igniter, which heats a surface to a high enough temperature that, when gas is introduced, the heated surface initiates combustion of the gas. Fuel for combustion, such as natural gas, may be provided by a gas valve 128.

The products of combustion are exhausted outside of the building, and an inducer blower 132 may be turned on prior to ignition of the burner 120. In a high efficiency furnace, the products of combustion may not be hot enough to have sufficient buoyancy to exhaust via conduction. Therefore, the inducer blower 132 creates a draft to exhaust the products of combustion. The inducer blower 132 may remain running while the burner 120 is operating. In addition, the inducer blower 132 may continue running for a set period of time after the burner 120 turns off.

A single enclosure, which will be referred to as an air handler unit 136, may include the filter 104, the circulator blower 108, the control module 112, the burner 120, the heat exchanger 124, the inducer blower 132, an expansion valve 140, an evaporator 144, and a condensate pan 146. In various implementations, the air handler unit 136 includes an electrical heating device (not shown) instead of or in addition to the burner 120. When used in addition to the burner 120, the electrical heating device may provide backup or secondary heat.

In FIG. 1, the HVAC system includes a split air conditioning system. Refrigerant is circulated through a compressor 148, a condenser 152, the expansion valve 140, and the evaporator 144. The evaporator 144 is placed in series with the supply air so that when cooling is desired, the evaporator 144 removes heat from the supply air, thereby cooling the supply air. During cooling, the evaporator 144 is cold, which causes water vapor to condense. This water vapor is collected in the condensate pan 146, which drains or is pumped out.

A control module 156 receives a cool request from the control module 112 and controls the compressor 148 accordingly. The control module 156 also controls a condenser fan 160, which increases heat exchange between the condenser 152 and outside air. In such a split system, the compressor 148, the condenser 152, the control module 156, and the condenser fan 160 are generally located outside of the building, often in a single condensing unit 164. A filter-drier 154 may be located between the condenser 152 and the expansion valve 140. The filter-drier 154 removes moisture and/or other contaminants from the circulating refrigerant.

In various implementations, the control module 156 may simply include a run capacitor, a start capacitor, and a contactor or relay. In fact, in certain implementations, the start capacitor may be omitted, such as when a scroll compressor instead of a reciprocating compressor is being used. The compressor 148 may be a variable-capacity compressor and may respond to a multiple-level cool request. For example, the cool request may indicate a mid-capacity call for cool or a high-capacity call for cool.

The electrical lines provided to the condensing unit 164 may include a 240 volt mains power line (not shown) and a 24 volt switched control line. The 24 volt control line may correspond to the cool request shown in FIG. 1. The 24 volt control line controls operation of the contactor. When the control line indicates that the compressor should be on, the contactor contacts close, connecting the 240 volt power supply to the compressor 148. In addition, the contactor may connect the 240 volt power supply to the condenser fan 160. In various implementations, such as when the condensing unit 164 is located in the ground as part of a geothermal system, the condenser fan 160 may be omitted. When the 240 volt mains power supply arrives in two legs, as is common in the U.S., the contactor may have two sets of contacts, and can be referred to as a double-pole single-throw switch.

Monitoring of operation of components in the condensing unit 164 and the air handler unit 136 has traditionally been performed by an expensive array of multiple discrete sensors that measure current individually for each component. For example, a first sensor may sense the current drawn by a motor, another sensor measures resistance or current flow of an igniter, and yet another sensor monitors a state of a gas valve. However, the cost of these sensors and the time required for installation of, and taking readings from, the sensors has made monitoring cost-prohibitive.

With specific reference to the filter 104, homeowners or occupants have traditionally used a schedule based system to replace the filter 104 of the HVAC system and/or a thermostat run-time based filter alert system. For example, a homeowner or occupant may replace the filter 104 every month, every two months, every three months, etc., based on the specific filter and/or manufacturer recommendations. The traditional schedule based system, however, may not account for performance characteristics of the filter 104, varying environmental factors that could increase or decrease the life of the filter 104, and/or the homeowner missing or delaying a scheduled filter change.

SUMMARY

This section provides a general summary of the disclosure, and is not a comprehensive disclosure of its full scope or all of its features.

A monitoring system for a heating, ventilation, and air conditioning (HVAC) system of a building is provided and includes a monitoring device installed at the building. The monitoring device is configured to (i) measure a current supplied to the HVAC system and (ii) transmit current data based on the measured current. The monitoring system includes a monitoring server, located remotely from the building, configured to receive the transmitted current data and, based on the received current data, (i) determine an average motor current over a predetermined time period and (ii) determine whether a failure has occurred in an air filter of the HVAC system based on a comparison of the average motor current with a predetermined threshold. The monitoring server generates a notification based on the comparison indicating that the failure has occurred in the air filter.

A method of monitoring a heating, ventilation, and air conditioning (HVAC) system of a building is provided an includes using a monitoring device installed at the building and measuring a current supplied to a plurality of components of the HVAC system. The method also includes transmitting current data based on the measured current to a monitoring server located remotely from the building. The method also includes, at the monitoring server, determining an average motor current over a predetermined time period. The method also includes, at the monitoring server, determining whether a failure has occurred in an air filter of the HVAC system based on a comparison of average motor current with a predetermined threshold. The method also includes generating a notification based on the comparison indicating that the failure has occurred in the air filter.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

According to the present disclosure, a monitoring system can be integrated with a residential or light commercial HVAC (heating, ventilation, or air conditioning) system of a building. The monitoring system can provide information on the status, maintenance, and efficiency of the HVAC system to customers and/or contractors associated with the building. For example, the building may be a single-family residence, and the customer may be the homeowner, a landlord, or a tenant. In other implementations, the building may be a light commercial building, and the customer may be the building owner, a tenant, or a property management company.

As used in this application, the term HVAC can encompass all environmental comfort systems in a building, including heating, cooling, humidifying, dehumidifying, and air exchanging and purifying, and covers devices such as furnaces, heat pumps, humidifiers, dehumidifiers, and air conditioners. HVAC systems as described in this application do not necessarily include both heating and air conditioning, and may instead have only one or the other.

In split HVAC systems with an air handler unit (often, located indoors) and a condensing unit (often, located outdoors), an air handler monitor module and a condensing monitor module, respectively, can be used. The air handler monitor module and the condensing monitor module may be integrated by the manufacturer of the HVAC system, may be added at the time of the installation of the HVAC system, and/or may be retrofitted to an existing HVAC system.

Figure 1:
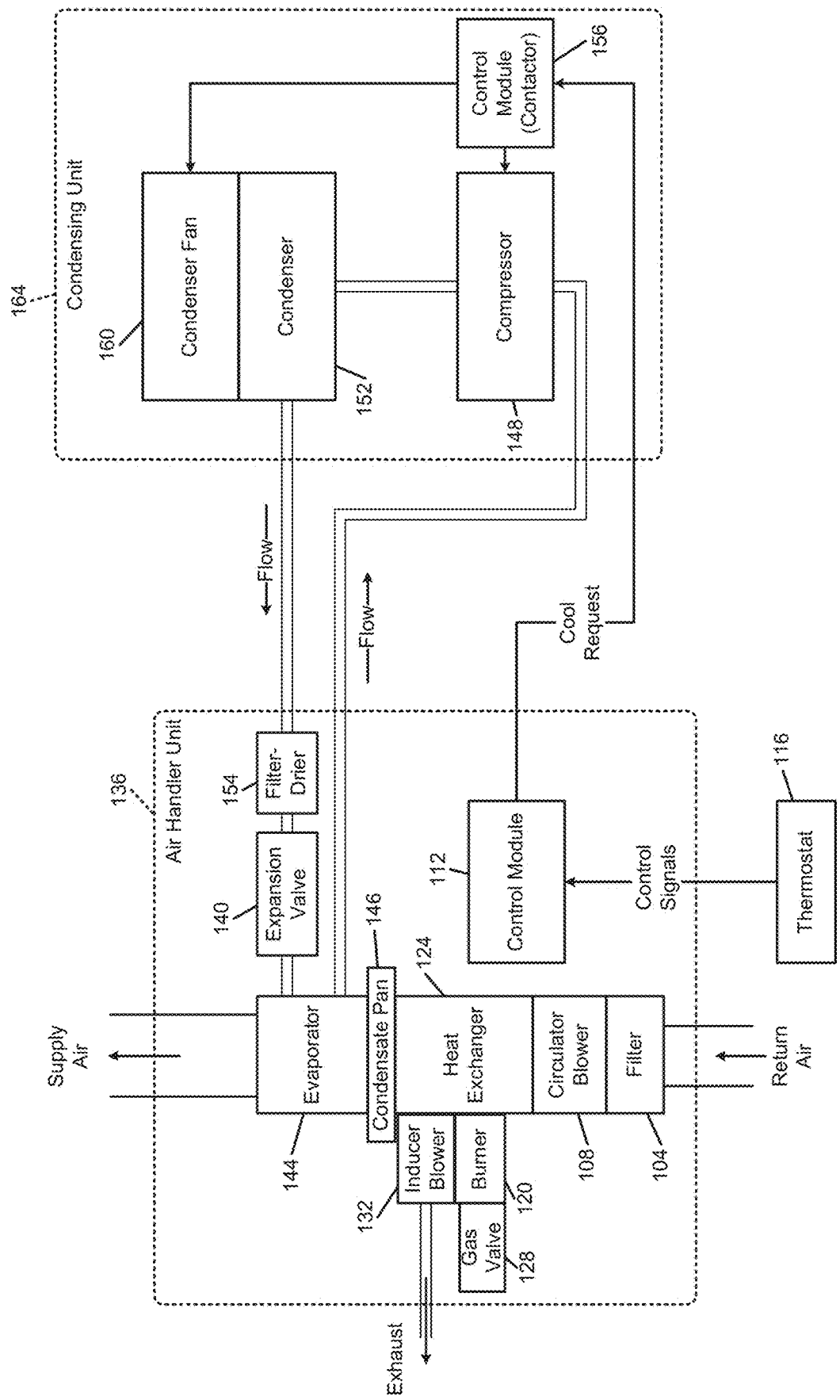
FIG. 1 is a block diagram of an example HVAC system according to the prior art.

In heat pump systems, the function of the air handler unit and the condensing unit are reversed depending on the mode of the heat pump. As a result, although the present disclosure uses the terms air handler unit and condensing unit, the terms indoor unit and outdoor unit could be used instead in the context of a heat pump. The terms indoor unit and outdoor unit emphasize that the physical locations of the components stay the same while their roles change depending on the mode of the heat pump. A reversing valve selectively reverses the flow of refrigerant from what is shown in FIG. 1 depending on whether the system is heating the building or cooling the building. When the flow of refrigerant is reversed, the roles of the evaporator and condenser are reversed—i.e., refrigerant evaporation occurs in what is labeled the condenser while refrigerant condensation occurs in what is labeled as the evaporator.

The air handler monitor and condensing monitor modules monitor operating parameters of associated components of the HVAC system. For example, the operating parameters may include power supply current, power supply voltage, operating and ambient temperatures of inside and outside air, refrigerant temperatures at various points in the refrigerant loop, fault signals, control signals, and humidity of inside and outside air.

The principles of the present disclosure may be applied to monitoring other systems, such as a hot water heater, a boiler heating system, a refrigerator, a refrigeration case, a pool heater, a pool pump/filter, etc. As an example, the hot water heater may include an igniter, a gas valve (which may be operated by a solenoid), an igniter, an inducer blower, and a pump. The monitoring system may analyze aggregate current readings to assess operation of the individual components of the hot water heater.

The air handler monitor and condensing monitor modules may communicate data between each other, while one or both of the air handler monitor and condensing monitor modules upload data to a remote location. The remote location may be accessible via any suitable network, including the Internet.

The remote location includes one or more computers, which will be referred to as servers. The servers execute a monitoring system on behalf of a monitoring company. The monitoring system receives and processes the data from the air handler monitor and condensing monitor modules of customers who have such systems installed. The monitoring system can provide performance information, diagnostic alerts, and error messages to a customer and/or third parties, such as designated HVAC contractors.

A server of the monitoring system includes a processor and memory. The memory stores application code that processes data received from the air handler monitor and condensing monitor modules and determines existing and/or impending failures, as described in more detail below. The processor executes this application code and stores received data either in the memory or in other forms of storage, including magnetic storage, optical storage, flash memory storage, etc. While the term server is used in this application, the application is not limited to a single server.

A collection of servers may together operate to receive and process data from the air handler monitor and condensing monitor modules of multiple buildings. A load balancing algorithm may be used between the servers to distribute processing and storage. The present application is not limited to servers that are owned, maintained, and housed by a monitoring company. Although the present disclosure describes diagnostics and processing and alerting occurring in a remote monitoring system, some or all of these functions may be performed locally using installed equipment and/or customer resources, such as on a customer computer or computers.

Customers and/or HVAC contractors may be notified of current and predicted issues affecting effectiveness or efficiency of the HVAC system, and may receive notifications related to routine maintenance. The methods of notification may take the form of push or pull updates to an application, which may be executed on a smart phone or other mobile device or on a standard computer. Notifications may also be viewed using web applications or on local displays, such as on a thermostat or other displays located throughout the building or on a display (not shown) implemented in the air handler monitor module or the condensing monitor module. Notifications may also include text messages, emails, social networking messages, voicemails, phone calls, etc.

The air handler monitor and condensing monitor modules may each sense an aggregate current for the respective unit without measuring individual currents of individual components. The aggregate current data may be processed using frequency domain analysis, statistical analysis, and state machine analysis to determine operation of individual components based on the aggregate current data. This processing may happen partially or entirely in a server environment, remote from the customer's building or residence.

The frequency domain analysis may allow individual contributions of HVAC system components to be determined. For example only, individual current contribution of a circulator blower motor within the HVAC system may be determined by the monitoring system. Some of the advantages of using an aggregate current measurement may include reducing the number of current sensors that would otherwise be necessary to monitor each of the HVAC system components. This reduces bill of materials costs, as well as installation costs and potential installation problems. Further, providing a single time-domain current stream may reduce the amount of bandwidth necessary to upload the current data. Nevertheless, the present disclosure could also be used with additional current sensors.

Based on measurements from the air handler monitor and condensing monitor modules, the monitoring company can determine whether HVAC components are operating at their peak performance and can advise the customer and the contractor when performance is reduced. This performance reduction may be measured for the system as a whole, such as in terms of efficiency, and/or may be monitored for one or more individual components.

In addition, the monitoring system may detect and/or predict failures of one or more components of the system. When a failure is detected, the customer can be notified and potential remediation steps can be taken immediately. For example, components of the HVAC system may be shut down to prevent or minimize damage, such as water damage, to HVAC components. The contractor can also be notified that a service call will be required. Depending on the contractual relationship between the customer and the contractor, the contractor may immediately schedule a service call to the building.

The monitoring system may provide specific information to the contractor, including identifying information of the customer's HVAC system, including make and model numbers, as well as indications of the specific part numbers that appear to be failing. Based on this information, the contractor can allocate the correct repair personnel that have experience with the specific HVAC system and/or component. In addition, the service technician is able to bring replacement parts, avoiding return trips after diagnosis.

Depending on the severity of the failure, the customer and/or contractor may be advised of relevant factors in determining whether to repair the HVAC system or replace some or all of the components of the HVAC system. For example only, these factors may include relative costs of repair versus replacement, and may include quantitative or qualitative information about advantages of replacement equipment. For example, expected increases in efficiency and/or comfort with new equipment may be provided. Based on historical usage data and/or electricity or other commodity prices, the comparison may also estimate annual savings resulting from the efficiency improvement.

As mentioned above, the monitoring system may also predict impending failures. This allows for preventative maintenance and repair prior to an actual failure. Alerts regarding detected or impending failures reduce the time when the HVAC system is out of operation and allows for more flexible scheduling for both the customer and contractor. If the customer is out of town, these alerts may prevent damage from occurring when the customer is not present to detect the failure of the HVAC system. For example, failure of heat in winter may lead to pipes freezing and bursting.

Alerts regarding potential or impending failures may specify statistical timeframes before the failure is expected. For example only, if a sensor is intermittently providing bad data, the monitoring system may specify an expected amount of time before it is likely that the sensor effectively stops working due to the prevalence of bad data. Further, the monitoring system may explain, in quantitative or qualitative terms, how the current operation and/or the potential failure will affect operation of the HVAC system. This enables the customer to prioritize and budget for repairs.

For the monitoring service, the monitoring company may charge a periodic rate, such as a monthly rate. This charge may be billed directly to the customer and/or may be billed to the contractor. The contractor may pass along these charges to the customer and/or may make other arrangements, such as by requiring an up-front payment upon installation and/or applying surcharges to repairs and service visits.

For the air handler monitor and condensing monitor modules, the monitoring company or contractor may charge the customer the equipment cost, including the installation cost, at the time of installation and/or may recoup these costs as part of the monthly fee. Alternatively, rental fees may be charged for the air handler monitor and condensing monitor modules, and once the monitoring service is stopped, the air handler monitor and condensing monitor modules may be returned.

The monitoring service may allow the customer and/or contractor to remotely monitor and/or control HVAC components, such as setting temperature, enabling or disabling heating and/or cooling, etc. In addition, the customer may be able to track energy usage, cycling times of the HVAC system, and/or historical data. Efficiency and/or operating costs of the customer's HVAC system may be compared against HVAC systems of neighbors, whose buildings will be subject to the same or similar environmental conditions. This allows for direct comparison of HVAC system and overall building efficiency because environmental variables, such as temperature and wind, are controlled.

The installer can provide information to the remote monitoring system including identification of control lines that were connected to the air handler monitor module and condensing monitor module. In addition, information such as the HVAC system type, year installed, manufacturer, model number, BTU rating, filter type, filter size, tonnage, etc.

In addition, because the condensing unit may have been installed separately from the furnace, the installer may also record and provide to the remote monitoring system the manufacturer and model number of the condensing unit, the year installed, the refrigerant type, the tonnage, etc. Upon installation, baseline tests are run. For example, this may include running a heating cycle and a cooling cycle, which the remote monitoring system records and uses to identify initial efficiency metrics. Further, baseline profiles for current, power, and frequency domain current can be established.

The server may store baseline data for the HVAC system of each building. The baselines can be used to detect changes indicating impending or existing failures. For example only, frequency-domain current signatures of failures of various components may be pre-programmed, and may be updated based on observed evidence from contractors. For example, once a malfunction in an HVAC system is recognized, the monitoring system may note the frequency data leading up to the malfunction and correlate that frequency signature with frequency signatures associated with potential causes of the malfunction. For example only, a computer learning system, such as a neural network or a genetic algorithm, may be used to refine frequency signatures. The frequency signatures may be unique to different types of HVAC systems but may share common characteristics. These common characteristics may be adapted based on the specific type of HVAC system being monitored.

The installer may collect a device fee, an installation fee, and/or a subscription fee from the customer. In various implementations, the subscription fee, the installation fee, and the device fee may be rolled into a single system fee, which the customer pays upon installation. The system fee may include the subscription fee for a set number of years, such as 1, 2, 5, or 10, or may be a lifetime subscription, which may last for the life of the home or the ownership of the building by the customer.

The monitoring system can be used by the contractor during and after installation and during and after repair (i) to verify operation of the air handler monitor and condensing monitor modules, as well as (ii) to verify correct installation of the components of the HVAC system. In addition, the customer may review this data in the monitoring system for assurance that the contractor correctly installed and configured the HVAC system. In addition to being uploaded to the remote monitoring service (also referred to as the cloud), monitored data may be transmitted to a local device in the building. For example, a smartphone, laptop, or proprietary portable device may receive monitoring information to diagnose problems and receive real-time performance data. Alternatively, data may be uploaded to the cloud and then downloaded onto a local computing device, such as via the Internet from an interactive web site.

The historical data collected by the monitoring system may allow the contractor to properly specify new HVAC components and to better tune configuration, including dampers and set points of the HVAC system. The information collected may be helpful in product development and assessing failure modes. The information may be relevant to warranty concerns, such as determining whether a particular problem is covered by a warranty. Further, the information may help to identify conditions, such as unauthorized system modifications, that could potentially void warranty coverage.

Original equipment manufacturers may subsidize partially or fully the cost of the monitoring system and air handler and condensing monitor modules in return for access to this information. Installation and service contractors may also subsidize some or all of these costs in return for access to this information, and for example, in exchange for being recommended by the monitoring system. Based on historical service data and customer feedback, the monitoring system may provide contractor recommendations to customers.

Figure 2A:
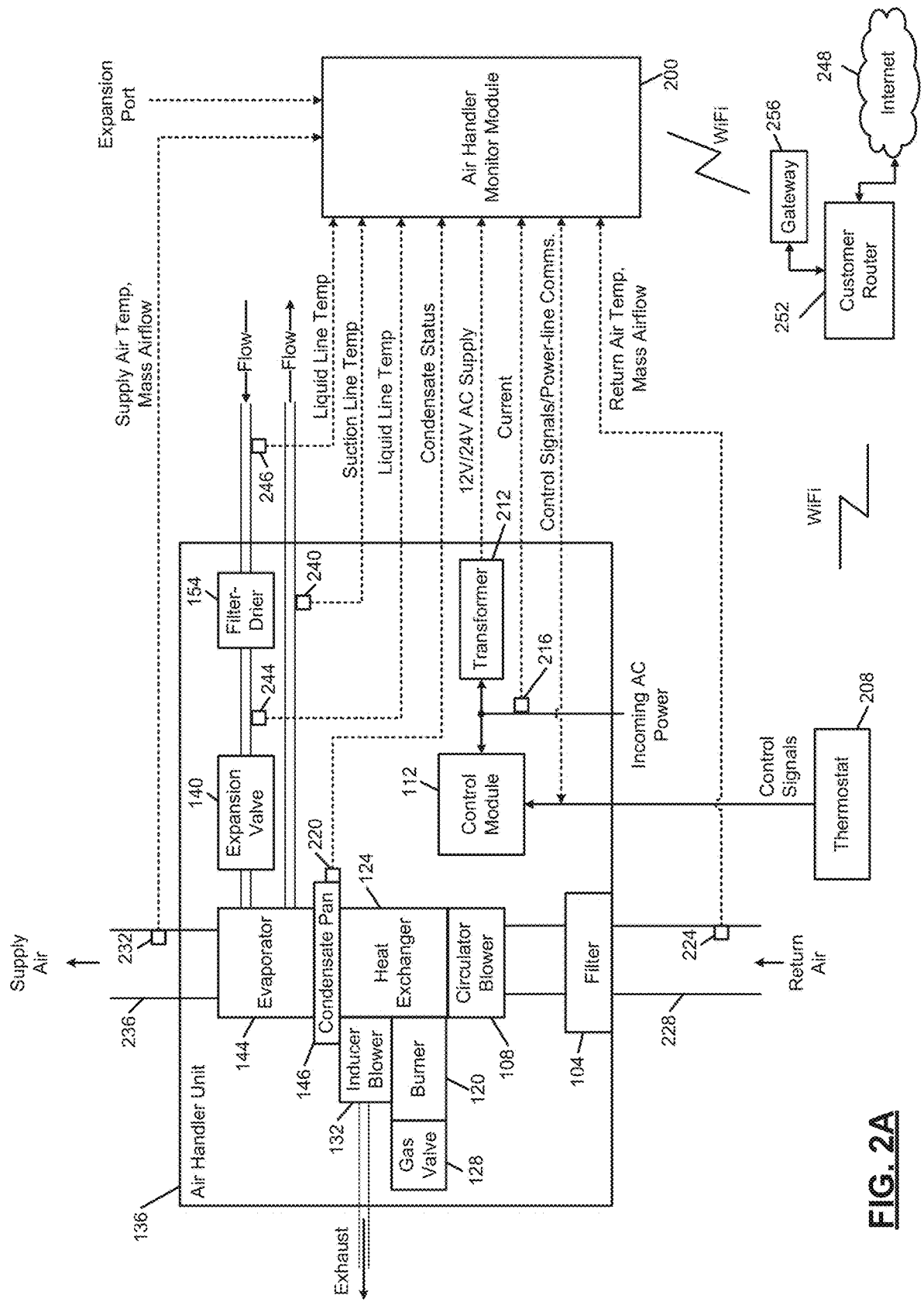
FIG. 2A is a functional block diagram of an example HVAC system including an implementation of an air handler monitor module.
Figure 2B:
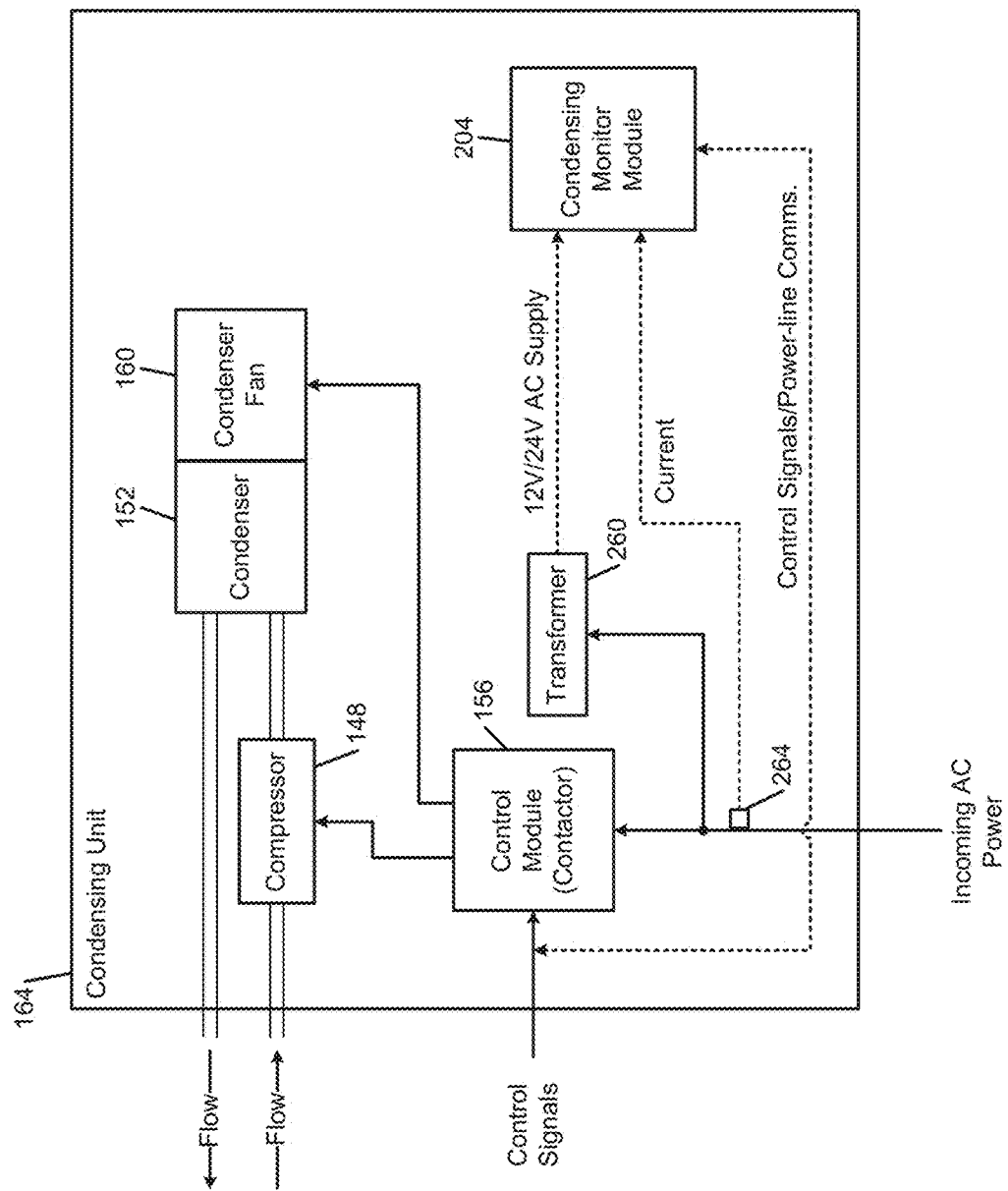
FIG. 2B is a functional block diagram of an example HVAC system including an implementation of a condensing monitor module.

FIGS. 2A-2B are functional block diagrams of an example monitoring system associated with an HVAC system of a building. The air handler unit 136 of FIG. 1 is shown for reference. Because the monitoring systems of the present disclosure can be used in retrofit applications, elements of the air handler unit 136 may remain unmodified. An air handler monitor module 200 and a condensing monitor module 204 can be installed in an existing system without needing to replace the original thermostat 116 shown in FIG. 1. To enable certain additional functionality, however, such as WiFi thermostat control and/or thermostat display of alert messages, the thermostat 116 of FIG. 1 may be replaced with a thermostat 208 having networking capability.

In many systems, the air handler unit 136 is located inside the building, while the condensing unit 164 is located outside the building. The present disclosure is not limited, and applies to other systems including, as examples only, systems where the components of the air handler unit 136 and the condensing unit 164 are located in close proximity to each other or even in a single enclosure. The single enclosure may be located inside or outside of the building. In various implementations, the air handler unit 136 may be located in a basement, garage, or attic. In ground source systems, where heat is exchanged with the earth, the air handler unit 136 and the condensing unit 164 may be located near the earth, such as in a basement, crawlspace, garage, or on the first floor, such as when the first floor is separated from the earth by only a concrete slab.

In FIG. 2A, the air handler monitor module 200 is shown external to the air handler unit 136, although the air handler monitor module 200 may be physically located outside of, in contact with, or even inside of an enclosure, such as a sheet metal casing, of the air handler unit 136.

When installing the air handler monitor module 200 in the air handler unit 136, power is provided to the air handler monitor module 200. For example, a transformer 212 can be connected to an AC line in order to provide AC power to the air handler monitor module 200. The air handler monitor module 200 may measure voltage of the incoming AC line based on this transformed power supply. For example, the transformer 212 may be a 10-to-1 transformer and therefore provide either a 12V or 24V AC supply to the air handler monitor module 200 depending on whether the air handler unit 136 is operating on nominal 120 volt or nominal 240 volt power. The air handler monitor module 200 then receives power from the transformer 212 and determines the AC line voltage based on the power received from the transformer 212.

For example, frequency, amplitude, RMS voltage, and DC offset may be calculated based on the measured voltages. In situations where 3-phase power is used, the order of the phases may be determined. Information about when the voltage crosses zero may be used to synchronize various measurements and to determine frequency of the AC power based on counting the number of zero crossings within a predetermine time period.

A current sensor 216 measures incoming current to the air handler unit 136. The current sensor 216 may include a current transformer that snaps around one power lead of the incoming AC power. The current sensor 216 may alternatively include a current shunt or a Hall Effect device. In various implementations, a power sensor (not shown) may be used in addition to or in place of the current sensor 216.

In various other implementations, electrical parameters (such as voltage, current, and power factor) may be measured at a different location, such as at an electrical panel providing power to the building from the electrical utility.

For simplicity of illustration, the control module 112 is not shown to be connected to the various components and sensors of the air handler unit 136. In addition, routing of the AC power to various powered components of the air handler unit 136, such as the circulator blower 108, the gas valve 128, and the inducer blower 132, are also not shown for simplicity. The current sensor 216 measures the current entering the air handler unit 136 and therefore represents an aggregate current of the current-consuming components of the air handler unit 136.

The aggregate current includes current drawn by all energy-consuming components of the air handler unit 136. For example only, the energy-consuming components can include a gas valve solenoid, an igniter, a circulator blower motor, an inducer blower motor, a secondary heat source, an expansion valve controller, a furnace control panel, a condensate pump, and a transformer, which may provide power to a thermostat. The energy-consuming components may also include the air handler monitor module 200 itself and the condensing monitor module 204.

It may be difficult to isolate the current drawn by any individual energy-consuming component. Further, it may be difficult to quantify or remove distortion in the aggregate current, such as distortion that may be caused by fluctuations of the voltage level of incoming AC power. As a result, processing is applied to the current, which includes, for example only, filtering, statistical processing, and frequency domain processing.

The control module 112 controls operation in response to signals from a thermostat 208 received over control lines. The air handler monitor module 200 monitors the control lines. The control lines may include a call for cool, a call for heat, and a call for fan. The control lines may include a line corresponding to a state of a reversing valve in heat pump systems.

The control lines may further carry calls for secondary heat and/or secondary cooling, which may be activated when the primary heating or primary cooling is insufficient. In dual fuel systems, such as systems operating from either electricity or natural gas, control signals related to the selection of the fuel may be monitored. Further, additional status and error signals may be monitored, such as a defrost status signal, which may be asserted when the compressor is shut off and a defrost heater operates to melt frost from an evaporator.

The control lines may be monitored by attaching leads to terminal blocks at the control module 112 at which the fan and heat signals are received. These terminal blocks may include additional connections where leads can be attached between these additional connections and the air handler monitor module 200. Alternatively, leads from the air handler monitor module 200 may be attached to the same location as the fan and heat signals, such as by putting multiple spade lugs underneath a signal screw head.

In various implementations, the cool signal from the thermostat 208 may be disconnected from the control module 112 and attached to the air handler monitor module 200. The air handler monitor module 200 can then provide a switched cool signal to the control module 112. This allows the air handler monitor module 200 to interrupt operation of the air conditioning system, such as upon detection of water by one of the water sensors. The air handler monitor module 200 may also interrupt operation of the air conditioning system based on information from the condensing monitor module 204, such as detection of a locked rotor condition in the compressor.

A condensate sensor 220 measures condensate levels in the condensate pan 146. If a level of condensate gets too high, this may indicate a plug or clog in the condensate pan 146 or a problem with hoses or pumps used for drainage from the condensate pan 146. The condensate sensor 220 may be installed along with the air handler monitor module 200 or may already be present. When the condensate sensor 220 is already present, an electrical interface adapter may be used to allow the air handler monitor module 200 to receive the readings from the condensate sensor 220. Although shown in FIG. 2A as being internal to the air handler unit 136, access to the condensate pan 146, and therefore the location of the condensate sensor 220, may be external to the air handler unit 136.

Additional water sensors, such as a conduction (wet floor) sensor may also be installed. The air handler unit 136 may be located on a catch pan, especially in situations where the air handler unit 136 is located above living space of the building. The catch pan may include a float switch. When enough liquid accumulates in the catch pan, the float switch provides an over-level signal, which may be sensed by the air handler monitor module 200.

A return air sensor 224 is located in a return air plenum 228. The return air sensor 224 may measure temperature and may also measure mass airflow. In various implementations, a thermistor may be multiplexed as both a temperature sensor and a hot wire mass airflow sensor. In various implementations, the return air sensor 224 is upstream of the filter 104 but downstream of any bends in the return air plenum 228.

A supply air sensor 232 is located in a supply air plenum 236. The supply air sensor 232 may measure air temperature and may also measure mass airflow. The supply air sensor 232 may include a thermistor that is multiplexed to measure both temperature and, as a hot wire sensor, mass airflow. In various implementations, such as is shown in FIG. 2A, the supply air sensor 232 may be located downstream of the evaporator 144 but upstream of any bends in the supply air plenum 236.

A differential pressure reading may be obtained by placing opposite sensing inputs of a differential pressure sensor (not shown) in the return air plenum 228 and the supply air plenum 236, respectively. For example only, these sensing inputs may be collocated or integrated with the return air sensor 224 and the supply air sensor 232, respectively. In various implementations, discrete pressure sensors may be placed in the return air plenum 228 and the supply air plenum 236. A differential pressure value can then be calculated by subtracting the individual pressure values.

The air handler monitor module 200 also receives a suction line temperature from a suction line temperature sensor 240. The suction line temperature sensor 240 measures refrigerant temperature in the refrigerant line between the evaporator 144 of FIG. 2A and the compressor 148 of FIG. 2B.

A liquid line temperature sensor 244 measures the temperature of refrigerant in a liquid line traveling from the condenser 152 of FIG. 2B to the expansion valve 140. When the filter-drier 154 is present, the liquid line temperature sensor 244 may be located between the filter-drier 154 and the expansion valve 140. In addition, a second liquid line temperature sensor 246 may be located in the refrigerant line prior to (i.e., upstream with respect to refrigerant flow) the filter-drier 154.

The air handler monitor module 200 may include one or more expansion ports to allow for connection of additional sensors and/or to allow connection to other devices, such as a home security system, a proprietary handheld device for use by contractors, or a portable computer.

The air handler monitor module 200 also monitors control signals from the thermostat 208. Because one or more of these control signals is also transmitted to the condensing unit 164 (shown in FIG. 2B), these control signals can be used for communication between the air handler monitor module 200 and the condensing monitor module 204 (shown in FIG. 2B).

The air handler monitor module 200 may transmit frames of data corresponding to periods of time. For example only, 7.5 frames may span one second (i.e., 0.1333 seconds per frame). Each frame of data may include voltage, current, temperatures, control line status, and water sensor status. Calculations may be performed for each frame of data, including averages, powers, RMS, and fast Fourier transform (FFT). The frame is then transmitted to the monitoring system.

The voltage and current signals may be sampled by an analog-to-digital converter at a certain rate, such as 1920 samples per second. The frame length may be measured in terms of samples. When a frame is 256 samples long, at a sample rate of 1920 samples per second, there will be 7.5 frames per second.

The sampling rate of 1920 Hz has a Nyquist frequency of 960 Hz and therefore allows an FFT bandwidth of up to approximately 960 Hz. An FFT limited to the time span of a single frame may be calculated for each frame. Then, for that frame, instead of transmitting all of the raw current data, only statistical data (such as average current) and frequency-domain data are transmitted.

This gives the monitoring system current data having a 7.5 Hz resolution, and gives frequency-domain data with approximately the 960 Hz bandwidth. The time-domain current and/or the derivative of the time-domain current may be analyzed to detect impending or existing failures. In addition, the current and/or the derivative may be used to determine which set of frequency-domain data to analyze. For example, certain time-domain data may indicate the approximate window of activation of a hot surface igniter, while frequency-domain data is used to assess the state of repair of the hot surface igniter.

In various implementations, the air handler monitor module 200 may only transmit frames during certain periods of time. These periods may be critical to operation of the HVAC system. For example, when thermostat control lines change, the air handler monitor module 200 may record data and transmit frames for a predetermined period of time after that transition. Then, if the HVAC system is operating, the air handler monitor module 200 may intermittently record data and transmit frames until operation of the HVAC system has completed.

The air handler monitor module 200 transmits data measured by both the air handler monitor module 200 itself and the condensing monitor module 204 over a wide area network 248, such as the Internet (referred to as the Internet 248). The air handler monitor module 200 may access the Internet 248 using a router 252 of the customer. The customer router 252 may already be present to provide Internet access to other devices (not shown) within the building, such as a customer computer and/or various other devices having Internet connectivity, such as a DVR (digital video recorder) or a video gaming system.

The air handler monitor module 200 communicates with the customer router 252 using a proprietary or standardized, wired or wireless protocol, such as Bluetooth, ZigBee (IEEE 802.15.4), 900 Megahertz, 2.4 Gigahertz, WiFi (IEEE 802.11). In various implementations, a gateway 256 is implemented, which creates a wireless network with the air handler monitor module 200. The gateway 256 may interface with the customer router 252 using a wired or wireless protocol, such as Ethernet (IEEE 802.3).

The thermostat 208 may also communicate with the customer router 252 using WiFi. Alternatively, the thermostat 208 may communicate with the customer router 252 via the gateway 256. In various implementations, the air handler monitor module 200 and the thermostat 208 do not communicate directly. However, because they are both connected through the customer router 252 to a remote monitoring system, the remote monitoring system may allow for control of one based on inputs from the other. For example, various faults identified based on information from the air handler monitor module 200 may cause the remote monitoring system to adjust temperature set points of the thermostat 208 and/or display warning or alert messages on the thermostat 208.

In various implementations, the transformer 212 may be omitted, and the air handler monitor module 200 may include a power supply that is directly powered by the incoming AC power. Further, power-line communications may be conducted over the AC power line instead of over a lower-voltage HVAC control line.

In various implementations, the current sensor 400 may be omitted, and instead a voltage sensor (not shown) may be used. The voltage sensor measures the voltage of an output of a transformer internal to the control module 112, the internal transformer providing the power (e.g., 24 Volts) for the control signals. The air handler monitor module 200 may measure the voltage of the incoming AC power and calculate a ratio of the voltage input to the internal transformer to the voltage output from the internal transformer. As the current load on the internal transformer increases, the impedance of the internal transformer causes the voltage of the output power to decrease. Therefore, the current draw from the internal transformer can be inferred from the measured ratio (also called an apparent transformer ratio). The inferred current draw may be used in place of the measured aggregate current draw described in the present disclosure.

In FIG. 2B, the condensing monitor module 204 is installed in the condensing unit 164. A transformer 260 converts incoming AC voltage into a stepped-down voltage for powering the condensing monitor module 204. In various implementations, the transformer 260 may be a 10-to-1 transformer. A current sensor 264 measures current entering the condensing unit 164. The condensing monitor module 204 may also measure voltage from the supply provided by the transformer 260. Based on measurements of the voltage and current, the condensing monitor module 204 may calculate power and/or may determine power factor.

A liquid line temperature sensor 266 measures the temperature of refrigerant traveling from the condenser 152 to the air handler unit 136. In various implementations, the liquid line temperature sensor 266 is located prior to any filter-drier, such as the filter-drier 154 of FIG. 2A. In normal operation, the liquid line temperature sensor 266 and the liquid line temperature sensor 246 of FIG. 2A may provide similar data, and therefore one of the liquid line temperature sensors 246 or 266 may be omitted. However, having both of the liquid line temperature sensors 246 and 266 may allow for certain problems to be diagnosed, such as a kink or other restriction in the refrigerant line between the air handler unit 136 and the condensing unit 164.

In various implementations, the condensing monitor module 204 may receive ambient temperature data from a temperature sensor (not shown). When the condensing monitor module 204 is located outdoors, the ambient temperature represents an outside ambient temperature. The temperature sensor supplying the ambient temperature may be located outside of an enclosure of the condensing unit 164. Alternatively, the temperature sensor may be located within the enclosure, but exposed to circulating air. In various implementations the temperature sensor may be shielded from direct sunlight and may be exposed to an air cavity that is not directly heated by sunlight. Alternatively or additionally, online (including Internet-based) weather data based on geographical location of the building may be used to determine sun load, outside ambient air temperature, precipitation, and humidity.

In various implementations, the condensing monitor module 204 may receive refrigerant temperature data from refrigerant temperature sensors (not shown) located at various points, such as before the compressor 148 (referred to as a suction line temperature), after the compressor 148 (referred to as a compressor discharge temperature), after the condenser 152 (referred to as a liquid line out temperature), and/or at one or more points along a coil of the condenser 152. The location of temperature sensors may be dictated by a physical arrangement of the condenser coils. Additionally or alternatively to the liquid line out temperature sensor, a liquid line in temperature sensor may be used. An approach temperature may be calculated, which is a measure of how close the condenser 142 has been able to bring the liquid line out temperature to the ambient air temperature.

During installation, the location of the temperature sensors may be recorded. Additionally or alternatively, a database may be maintained that specifies where temperature sensors are placed. This database may be referenced by installers and may allow for accurate remote processing of the temperature data. The database may be used for both air handler sensors and compressor/condenser sensors. The database may be prepopulated by the monitoring company or may be developed by trusted installers, and then shared with other installation contractors.

As described above, the condensing monitor module 204 may communicate with the air handler monitor module 200 over one or more control lines from the thermostat 208. In these implementations, data from the condensing monitor module 204 is transmitted to the air handler monitor module 200, which in turn uploads the data over the Internet 248.

In various implementations, the transformer 260 may be omitted, and the condensing monitor module 204 may include a power supply that is directly powered by the incoming AC power. Further, power-line communications may be conducted over the AC power line instead of over a lower-voltage HVAC control line.

Figure 2C:
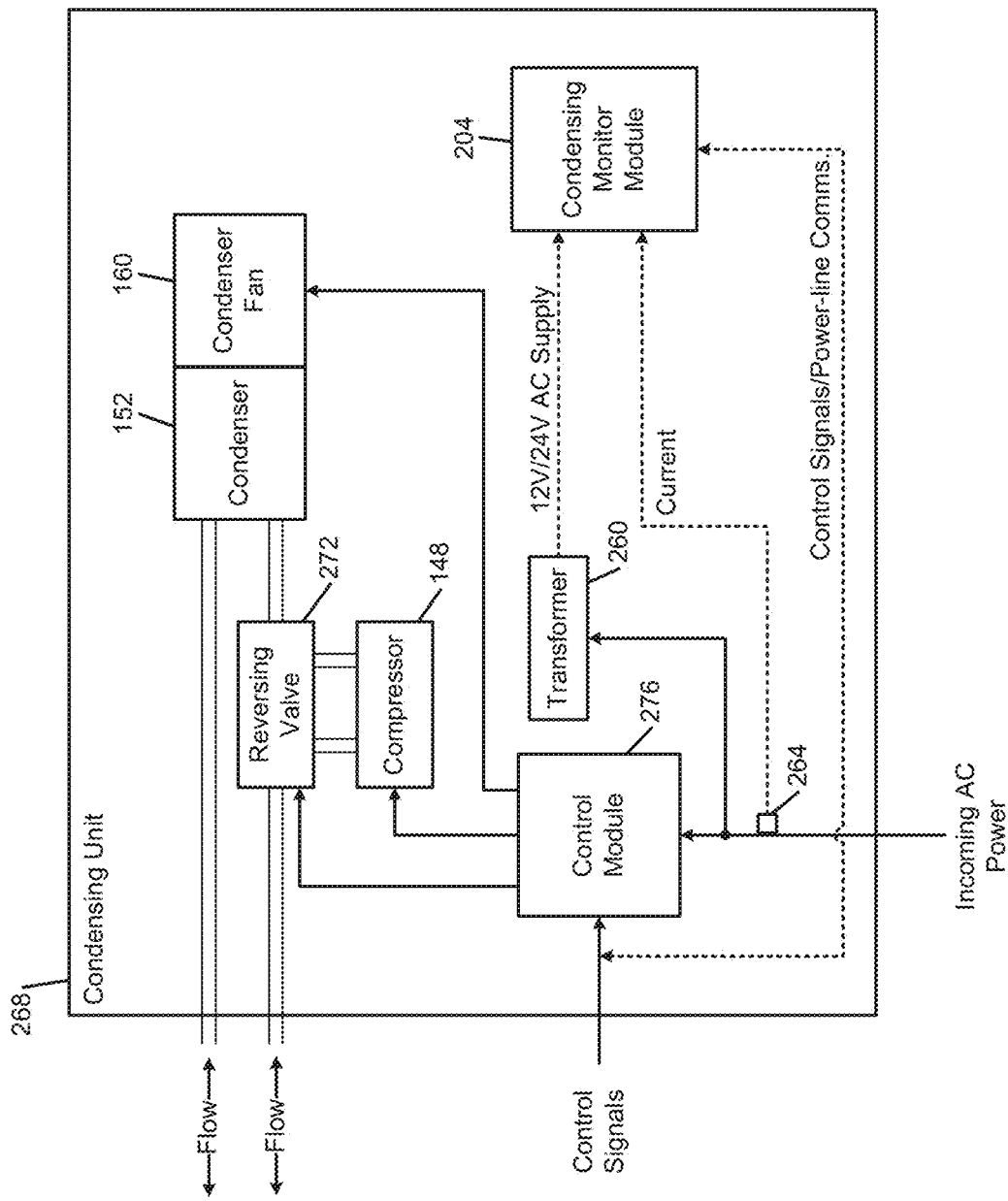
FIG. 2C is a functional block diagram of an example HVAC system based on a heat pump.

In FIG. 2C, an example condensing unit 268 is shown for a heat pump implementation. The condensing unit 268 may be configured similarly to the condensing unit 164 of FIG. 2B. Similarly to FIG. 2B, the transformer 260 may be omitted in various implementations. Although referred to as the condensing unit 268, the mode of the heat pump determines whether the condenser 152 of the condensing unit 268 is actually operating as a condenser or as an evaporator. A reversing valve 272 is controlled by a control module 276 and determines whether the compressor 148 discharges compressed refrigerant toward the condenser 152 (cooling mode) or away from the condenser 152 (heating mode).

Figure 3A:
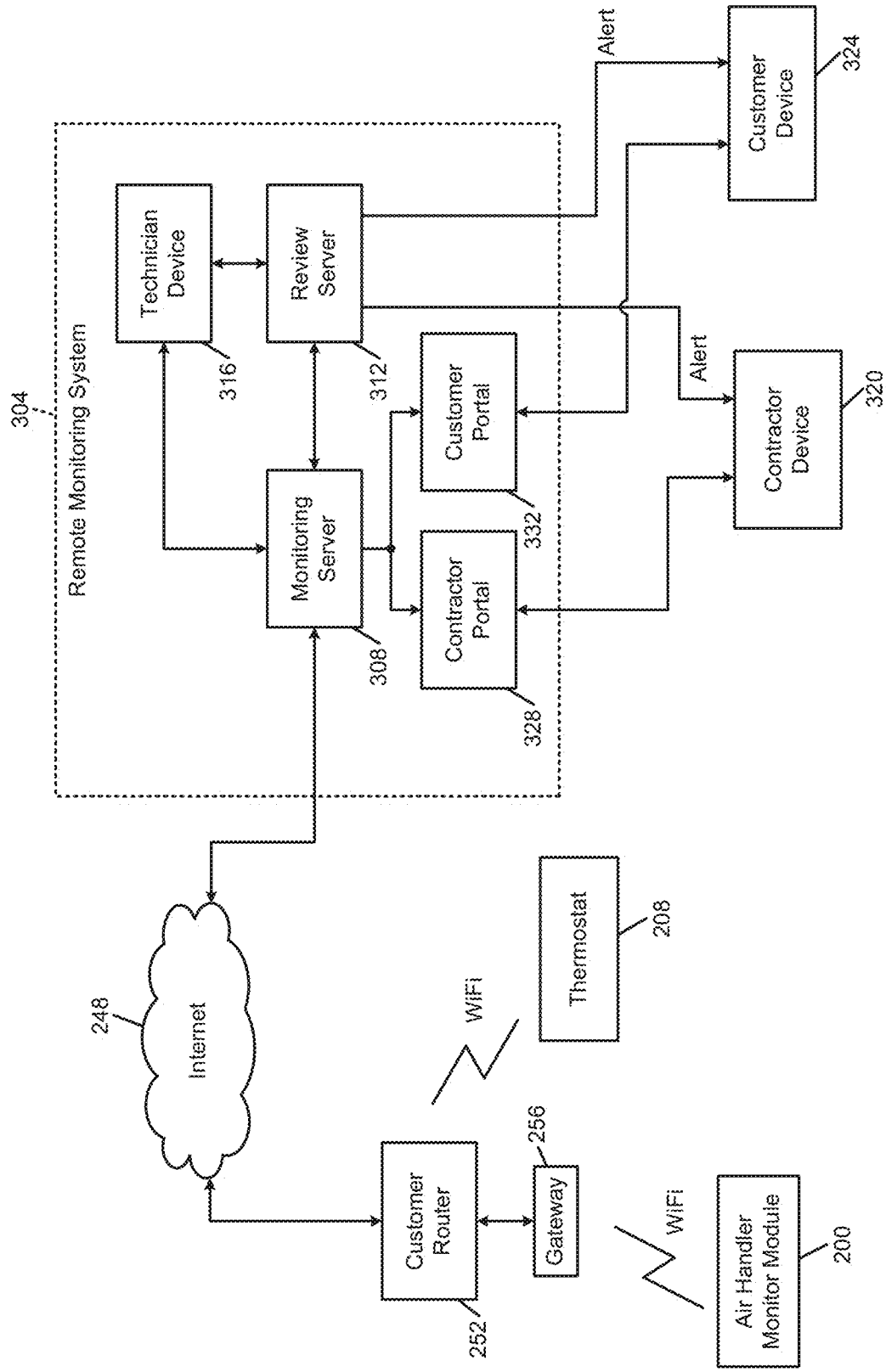
FIG. 3A is a high level functional block diagram of an example system including an implementation of a remote monitoring system.

In FIG. 3A, the air handler monitor module 200 and the thermostat 208 are shown communicating, using the customer router 252, with a remote monitoring system 304 via the Internet 248. In other implementations, the condensing monitor module 204 may transmit data from the air handler monitor module 200 and the condensing monitor module 204 to an external wireless receiver. The external wireless receiver may be a proprietary receiver for a neighborhood in which the building is located, or may be an infrastructure receiver, such as a metropolitan area network (such as WiMAX), a WiFi access point, or a mobile phone base station.

The remote monitoring system 304 includes a monitoring server 308 that receives data from the air handler monitor module 200 and the thermostat 208 and maintains and verifies network continuity with the air handler monitor module 200. The monitoring server 308 executes various algorithms to identify problems, such as failures or decreased efficiency, and to predict impending faults.

The monitoring server 308 may notify a review server 312 when a problem is identified or a fault is predicted. This programmatic assessment may be referred to as an advisory. Some or all advisories may be triaged by a technician to reduce false positives and potentially supplement or modify data corresponding to the advisory. For example, a technician device 316 operated by a technician is used to review the advisory and to monitor data (in various implementations, in real-time) from the air handler monitor module 200 via the monitoring server 308.

The technician using the technician device 316 reviews the advisory. If the technician determines that the problem or fault is either already present or impending, the technician instructs the review server 312 to send an alert to either or both of a contractor device 320 or a customer device 324. The technician may determine that, although a problem or fault is present, the cause is more likely to be something different than specified by the automated advisory. The technician can therefore issue a different alert or modify the advisory before issuing an alert based on the advisory. The technician may also annotate the alert sent to the contractor device 320 and/or the customer device 324 with additional information that may be helpful in identifying the urgency of addressing the alert and presenting data that may be useful for diagnosis or troubleshooting.

In various implementations, minor problems may be reported to the contractor device 320 only, and not to the customer device 324, so as not to alarm the customer or inundate the customer with alerts. Whether the problem is considered to be minor may be based on a threshold. For example, an efficiency decrease greater than a predetermined threshold may be reported to both the contractor and the customer, while an efficiency decrease less than the predetermined threshold is reported to only the contractor.

In some circumstances, the technician may determine that an alert is not warranted based on the advisory. The advisory may be stored for future use, for reporting purposes, and/or for adaptive learning of advisory algorithms and thresholds. In various implementations, a majority of generated advisories may be closed by the technician without sending an alert.

Based on data collected from advisories and alerts, certain alerts may be automated. For example, analyzing data over time may indicate that whether a certain alert is sent by a technician in response to a certain advisory depends on whether a data value is on one side of a threshold or another. A heuristic can then be developed that allows those advisories to be handled automatically without technician review. Based on other data, it may be determined that certain automatic alerts had a false positive rate over a threshold. These alerts may be put back under the control of a technician.

In various implementations, the technician device 316 may be remote from the remote monitoring system 304 but connected via a wide area network. For example only, the technician device 316 may include a computing device such as a laptop, desktop, or tablet.

With the contractor device 320, the contractor can access a contractor portal 328, which provides historical and real-time data from the air handler monitor module 200. The contractor using the contractor device 320 may also contact the technician using the technician device 316. The customer using the customer device 324 may access a customer portal 332 in which a graphical view of the system status as well as alert information is shown. The contractor portal 328 and the customer portal 332 may be implemented in a variety of ways according to the present disclosure, including as an interactive web page, a computer application, and/or an app for a smartphone or tablet.

In various implementations, data shown by the customer portal may be more limited and/or more delayed when compared to data visible in the contractor portal 328. In various implementations, the contractor device 320 can be used to request data from the air handler monitor module 200, such as when commissioning a new installation.

Figure 3B:
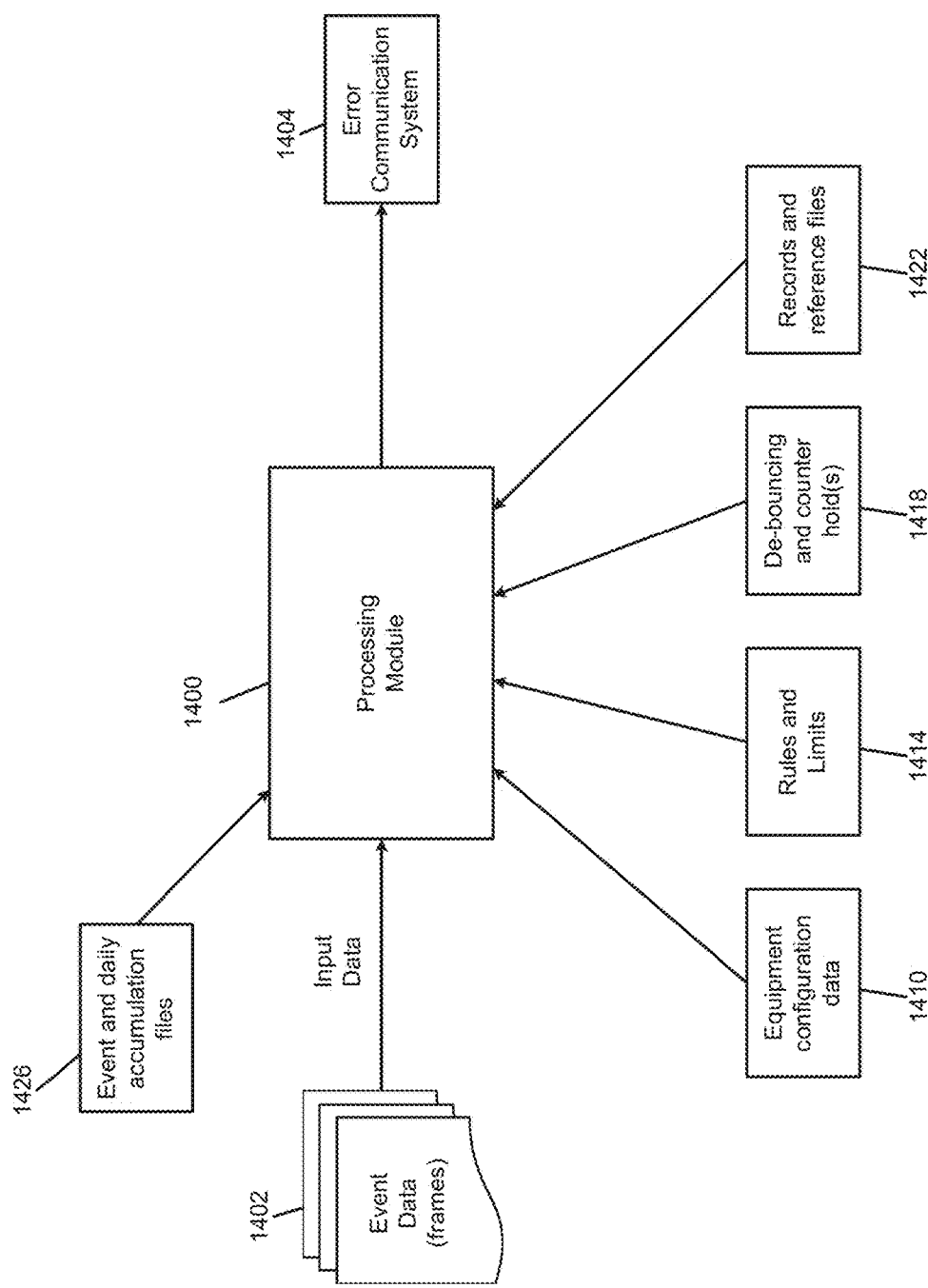
FIG. 3B is a functional block diagram of an example implementation for cloud processing of captured data.

In FIG. 3B, an example representation of cloud processing is shown. In some implementations, the monitoring server 308 includes a processing module 1400. The processing module 1400 receives event data 1402 in the form of frames. The processing module 1400 uses various input data for detection and prediction of faults. Identified faults are passed to an error communication system 1404. The event data 1402 may be stored upon receipt, for example, from the air handler monitor module 200 and/or the condensing monitor module 204.

The processing module 1400 may then perform each prediction or detection task with relevant data from the event data 1402. In various implementations, certain processing operations are common to more than one detection or prediction operation. This data may therefore be cached and reused. The processing module 1400 receives information about equipment configuration 1410, such as control signal mapping.

The processing module 1400 receives rules and limits 1414. The rules and limits 1414 determine whether sensor values are out of bounds, which may indicate sensor failures. In addition, the rules and limits 1414 may indicate that sensor values cannot be trusted when parameters such as current and voltage are outside of predetermined limits. For example only, if the AC voltage sags, such as during a brownout, data taken during that time may be discarded as unreliable.

In one implementation, de-bouncing and counter holds 1418 may store rolling averages of current, voltage, and temperature. In another implementation, de-bouncing and counter holds 1418 may store counts of anomaly detection. For example only, detection of a single solenoid-operated gas valve malfunction may increment a counter, but not trigger a fault. Only if multiple solenoid-operated gas valve failures are detected is an error signaled. This can eliminate false positives. For example only, a single failure of an energy-consuming component may cause a corresponding counter to be incremented by one, while detection of proper operation may lead to the corresponding counter being decremented by one. In this way, if faulty operation is prevalent, the counter will eventually increase to a point where an error is signaled. Records and reference files 1422 may store frequency and time domain data establishing baselines for detection and prediction. De-bouncing encompasses an averaging process that may remove glitches and/or noise. For example, a moving or windowed average may be applied to input signals to avoid spurious detection of a transition when in fact only a spike (or, glitch) of noise was present.

A basic failure-to-function fault may be determined by comparing a control line state against an operational state based on current and/or power. Basic function may be verified by temperature, and improper operation may contribute to a counter being incremented. This analysis may rely on return air temperature, supply air temperature, liquid line in temperature, voltage, current, real power, control line status, compressor discharge temperature, liquid line out temperature, and ambient temperature.

Sensor error faults may be detected by checking sensor values for anomalous operation, such as may occur for open-circuit or short-circuit faults. The values for those determinations may be found in the rules and limits 1414. This analysis may rely on return air temperature, supply air temperature, liquid line in temperature (which may correspond to a temperature of the refrigerant line in the air handler, before or after the expansion valve), control line status, compressor discharge temperature, liquid line out temperature, and ambient temperature.

When the HVAC system is off, sensor error faults may also be diagnosed. For example, based on control lines indicating that the HVAC system has been off for an hour, processing module 1400 may check whether the compressor discharge temperature, liquid line out temperature, and ambient temperature are approximately equal. In addition, the processing module 1400 may also check that the return air temperature, the supply air temperature, and the liquid line in temperature are approximately equal.

The processing module 1400 may compare temperature readings and voltages against predetermined limits to determine voltage faults and temperature faults. These faults may cause the processing module 1400 to ignore various faults that could appear present when voltages or temperatures are outside of the predetermined limits.

The processing module 1400 may check the status of discrete sensors to determine whether specifically-detected fault conditions are present. For example only, the status of condensate, float switch, and floor sensor water sensors are checked. The water sensors may be cross-checked against operating states of the HVAC system. For example only, if the air conditioning system is not running, it would not be expected that the condensate tray would be filling with water. This may instead indicate that one of the water sensors is malfunctioning. Such a determination could initiate a service call to fix the sensor so that it can properly identify when an actual water problem is present.

Figure 4:
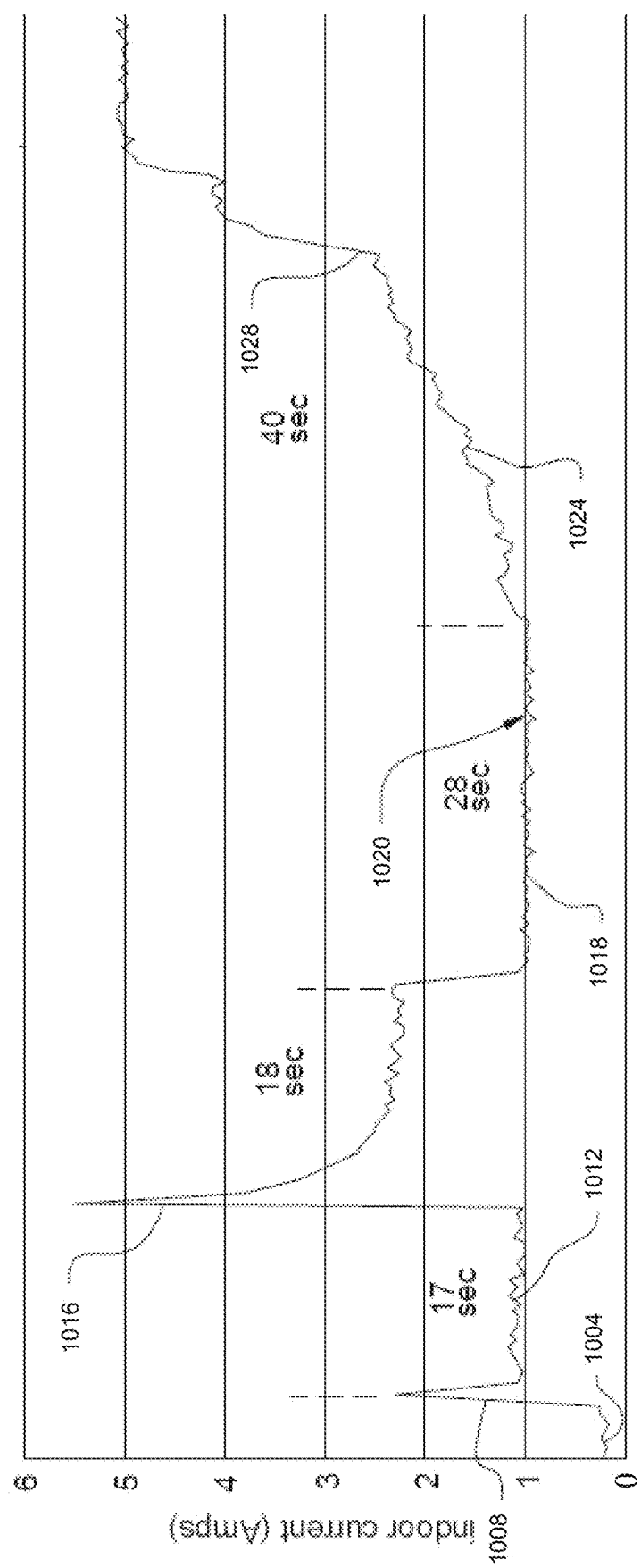
FIG. 4 is an example time domain trace of aggregate current for a beginning of a heat cycle.

The processing module 1400 may determine whether the proper sequence of furnace initiation is occurring. This may rely on event and daily accumulation files 1426. The processing module 1400 may perform state sequence decoding, such as by looking at transitions as shown in FIG. 4 and expected times during which those transitions are expected. Detected furnace sequences are compared against a reference case and errors are generated based on exceptions. The furnace sequence may be verified with temperature readings, such as observing whether, while the burner is on, the supply air temperature is increasing with respect to the return air temperature. The processing module 1400 may also use FFT processing to determine that the sparker or igniter operation and solenoid-operated gas valve operation are adequate.

The processing module 1400 may determine whether a flame probe or flame sensor is accurately detecting flame. State sequence decoding may be followed by determining whether a series of furnace initiations are performed. If so, this may indicate that the flame probe is not detecting flame and the burner is therefore being shut off. The frequency of retries may increase over time when the flame probe is not operating correctly.

The processing module 1400 may evaluate heat pump performance by comparing thermal performance against power consumption and unit history. This may rely on data concerning equipment configuration 1410, including compressor maps when available.

The processing module 1400 may determine refrigerant level of the air conditioning system. For example, the processing module 1400 may analyze the frequency content of the compressor current and extract frequencies at the third, fifth, and seventh harmonics of the power line frequencies. This data may be compared, based on ambient temperature, to historical data from when the air conditioning system was known to be fully charged. Generally, as charge is lost, the surge frequency may decrease. Additional data may be used for reinforcement of a low refrigerant level determination, such as supply air temperature, return air temperature, liquid line in temperature, voltage, real power, control line status, compressor discharge temperature, and liquid line out temperature.

The processing module 1400 may alternatively determine a low refrigerant charge by monitoring deactivation of the compressor motor by a protector switch, which may indicate a low refrigerant charge condition. To prevent false positives, the processing module 1400 may ignore compressor motor deactivation that happens sooner than a predetermined delay after the compressor motor is started, as this may instead indicate another problem, such as a stuck rotor.

The processing module 1400 may determine the performance of a capacitor in the air handler unit, such as a run capacitor for the circulator blower. Based on return air temperature, supply air temperature, voltage, current, real power, control line status, and FFT data, the processing module 1400 determines the time and magnitude of the start current and checks the start current curve against a reference. In addition, steady state current may be compared over time to see whether an increase results in a corresponding increase in the difference between the return air temperature and the supply air temperature.

Similarly, the processing module 1400 determines whether the capacitor in the compressor/condenser unit is functioning properly. Based on compressor discharge temperature, liquid line out temperature, ambient temperature, voltage, current, real power, control line status, and FFT current data, control determines a time and magnitude of start current. This start current is checked against a reference in the time and/or frequency domains. The processing module 1400 may compensate for changes in ambient temperature and in liquid line in temperature. The processing module 1400 may also verify that increases in steady state current result in a corresponding increase in the difference between the compressor discharge temperature and the liquid line in temperature.

The processing module may calculate and accumulate energy consumption data over time. The processing module may also store temperatures on a periodic basis and at the end of heat and cool cycles. In addition, the processing module 1400 may record lengths of run times. An accumulation of run times may be used in determining the age of wear items, which may benefit from servicing, such as oiling, or preemptive replacing.

The processing module 1400 may also grade the customer's equipment. The processing module 1400 compares heat flux generated by the HVAC equipment against energy consumption. The heat flux may be indicated by return air temperature and/or indoor temperature, such as from a thermostat. The processing module 1400 may calculate the envelope of the building to determine the net flux. The processing module 1400 may compare the equipment's performance, when adjusted for building envelope, against other similar systems. Significant deviations may cause an error to be indicated.

A dirty filter may be detected in light of changes in power, current, and power factor coupled with an increase in temperature split and reduced differential pressure. The power, current, and power factor may be dependent on motor type. When a mass airflow sensor is available, the mass flow sensor may be able to directly indicate a flow restriction in systems using a permanent split capacitor motor. The processing module 1400 uses a change in current or power and the type of circulator blower motor to determine the change in load. This change in load can be used to determine whether the filter is dirty.

In some implementations, the processing module 1400 performs power based air filter diagnostics. The power based air filter diagnostics include monitoring changes in current or power utilized by at least one component of the HVAC system. In response to changes in current or power utilized by the at least one component, the processing module 1400 determines whether to generate an alert to the customer indicating that performance of the filter 104 within the HVAC system has degraded. It can be appreciated that an air filter with a degraded performance may require replacement. As such, the processing module 1400 may selectively recommend and/or instruct the customer to replace the air filter based on the monitored changes in the power or current of the at least one component.

In one implementation, the processing module 1400 receives the aggregate current data from the air handler monitor module 200 as described above. The processing module 1400 is configured to determine a portion of the aggregate current data associated with a current draw of an individual component of the HVAC system. By way of non-limiting example only, the processing module 1140 may determine an average daily current draw associated with the circulator blower 108. The current draw associated with the circulator blower 108 is hereinafter referred to as motor current of the circulator blower 108 or, simply, motor current.

The processing module 1400 determines a degraded performance of the filter 104 based on changes in an average daily motor current. In some implementations, the circulator blower 108 may be an electrically commutated motor (ECM). In other implementations, the circulator blower 108 may be a permanent split capacitor (PSC) motor. The processing module 1400 may be configured to determine a motor type of the circulator blower 108.

For example only, the processing module 1400 monitors an average motor current draw corresponding to the blower 108 over a predetermined period of time. The predetermined period of time may be a day, a week, a month, or any suitable period of time beginning after the HVAC system is installed. The predetermined period may vary depending on various aspects of the HVAC system, such as, capacity, age, or any other suitable aspect. The processing module 1400 determines a motor type of the blower 108 based on a trend of the motor current over the predetermined period. For example only, the processing module 1400 determines the blower 108 comprises a constant torque ECM motor when the processing module 1400 determines the trend of the motor current is increasing over the period. Similarly, the processing module 1400 determines the blower 108 comprises a PSC motor when the processing module 1400 determines the trend of the motor current is decreasing.

Alternatively or additionally, the motor type of the circulator blower 108 may be known or programmed into the processing module 1400 or stored in a look-up table in a memory accessible to the processing module 1400.

The processing module 1400 monitors a change in motor current of the circulator blower 108 over a period of time. Depending on the motor type, the processing module 1400 monitors an increase in motor current over the time period or a decrease in motor current over the time period. For example, when the circulator blower 108 is an ECM motor, as the filter 104 becomes dirty, the processing module 1400 monitors a change indicating an increase in motor current over a period of time. Conversely, when the circulator blower 108 is a PSC motor, as the filter 104 becomes dirty, the processing module 1400 monitors a decrease in motor current over a period of time. While the example embodiments of the present disclosure are described in the context of the circulator blower 108 comprising either a PSC motor or an ECM motor, the principles of the present disclosure apply equally to example embodiments wherein the circulator blower 108 comprises any other suitable motor type.

In addition, while an example embodiment may be described herein in the context of monitoring an increase in current draw of an ECM motor by determining, for example, whether the current draw is greater than a predetermined threshold, it is understood that the same teachings apply to monitoring a decrease in current draw of a PSC motor by determining, for example, whether the current draw is less than a predetermined threshold.

In some implementations, the processing module 1400 is configured to compare the received motor current data to a predetermined baseline current draw. The baseline current draw may be predetermined prior to installation of the HVAC system based on the type and characteristics of various electrical components of the HVAC system. In other words, the HVAC system is comprised of a plurality of components that each draw current during operation of the HVAC system and each of the plurality of electrical components, when operating as designed, have an expected current draw. The expected current draw for one of the plurality of electrical components is the baseline current draw for that particular component. In the example implementation, the circulator blower 108, when operating as designed, i.e., is not faulty or defective, has an expected current draw, or baseline current draw. In other words, when the circulator blower 108 is operating as the circulator blower 108 is designed to operate, the circulator blower 108 is expected to draw the baseline current draw.

In another implementation, the processing module 1400 may learn a current draw baseline based on an average current draw of the blower 108 taken over time. The processing module 1400 receives average daily motor current draw data corresponding to the measured current draw of the blower 108 over time. The processing module 1400 is configured to analyze the average daily motor current data over a predetermined period. In one example, when the HVAC system is initially installed, the processing module 1400 may receive a baseline current draw associated with the blower 108 based on the type, make, model, and installation of the blower 108 within the HVAC system. The processing module 1400 may be configured to maintain this received value as the baseline current draw during an initial time period, such as the first month that the HVAC system is in operation. In other words, the processing module 1400 may set an initial baseline current draw equal to an average motor current draw over the initial time period.

In this manner, the processing module 1400 may determine a baseline current draw based on an actual performance rather than a predetermined expected performance. It is understood that the processing module 1400 may determine the initial baseline current draw in response to a trend analysis of measured current draw data over any period of time, including but not limited to, a day, a week, a month, a year, and so on.

Further, while analyzing the HVAC system in the first month of operation is described, the processing module 1400 may be configured to periodically re-establish the baseline current draw. In some implementations, the processing module 1400 may annually compare a trend analysis of measured motor current data to a baseline and adjust the baseline in response to the comparison. In this manner, the processing module 1400 may account for normal degradation of the blower 108 and/or system over time.

However, many factors may result in the circulator blower 108 drawing more or less current than the baseline current draw. In one example, as particulates gather on the filter 104 within the HVAC system, the current draw of the circulator blower 108 may increase in the case of an ECM motor and decrease in the case of a PSC motor. It is understood that while only a degraded air filter is described, the circulator blower 108 may vary current draw as a result of a fault in the blower 108, a fault elsewhere in the HVAC system, or any other possible anomaly within the HVAC system that causes a change in current draw by the blower 108.

As described above, the processing module 1400 compares an average daily motor current draw of the circulator blower 108 to the baseline current draw associated with the circulator blower 108. While an average daily current draw is described in the current example, it is understood that the processing module 1400 may be configured to analyze current data in any interval, including, for example, hourly, daily, weekly, monthly, and so on. In the case of an ECM motor, when the processing module 1400 determines that the motor current draw is greater than the baseline current draw, the processing module 1400 may then determine whether the motor current draw is greater than a predetermined current threshold. In the case of a PSC motor, when the processing module 1400 determines that the motor current draw is less than the baseline current draw, the processing module 1400 may then determine whether the motor current draw is less than a predetermined current threshold.

The predetermined current threshold may be determined based on characteristics of the components of HVAC system. Additionally or alternatively, the predetermined current threshold may be set in response to the processing module 1400 learning the initial baseline. For example, the current threshold may be set relative to the baseline. As the processing module 1400 learns the baseline, the threshold may be set at a relative value corresponding to the baseline. By way of non-limiting example, the threshold may be initially set at 5% above or below the baseline, depending on whether an ECM motor or PSC motor is used.

The current threshold may be a value that allows the measured current draw to be above an acceptable deviation from the baseline for an ECM motor. Likewise, for a PSC motor, the current threshold may correspond to a value that allows the measured current draw to be below an acceptable deviation from the baseline. For example, as described above, the baseline current draw may be a learned current draw average for the circulator blower 108. The actual current draw is expected to be at or near the baseline current draw when the HVAC system is operating within normal operating parameters. A dirty filter, however, may cause the HVAC system to operate outside of normal operating parameters.

As the baseline current draw is updated or modified, a corresponding update or modification may be made to the predetermined threshold. Motor current may measure within an acceptable operating tolerance before the filter 104 begins collecting dirt or particles. For example, the circulator blower 108 may be said to be operating normally with an expected filter performance when the current draw is 5% more or less than the baseline current draw. However, when the circulator blower 108 is drawing current above or below this tolerance, the measured motor current may indicate a fault within the HVAC system, such as a dirty filter 104, for example.

When the processing module 1400 determines that the average daily motor current is greater than the predetermined threshold in the case of an ECM motor, or below the predetermined threshold in the case of a PSC motor, the processing module 1400 may generate an alert indicating that the filter 104 is dirty. As described above, with respect to FIG. 3A, processing module 1400 may communicate the alert to a technician for further analysis of the motor current data or to the customer alerting the customer to change the filter 104 of the HVAC system. Conversely, when the processing module 1400 determines that the average daily motor current is not greater than the predetermined threshold in the case of an ECM motor or not less than the predetermined threshold in the case of a PSC motor, the processing module 1400 may simply store the average daily motor current data for future reference.

In some implementations, the processing module 1400 analyzes historical data associated with the circulator blower 108. For example only, as described above, the processing module 1400 determines whether an average daily motor current draw is greater than a baseline current draw in the case of an ECM motor or less than a baseline current draw in the case of a PSC motor. For an ECM motor, when the processing module 1400 determines that the current draw is greater than the baseline current draw, the processing module 1400 determines whether the current draw is also greater than the predetermined threshold. For a PSC motor, when the processing module 1400 determines that the current draw is less than the baseline current draw, the processing module 1400 determines whether the current draw is also less than the predetermined threshold. When the processing module 1400 determines that the current draw is greater than or less than the predetermined threshold, as appropriate for an ECM or PSC motor, the processing module 1400 may then generate an alert indicating that the filter 104 within the HVAC system is faulty (i.e., dirty). Alternatively, the processing module 1400 may analyze historical data corresponding to the blower 108 prior to generating the alert.

For example, the processing module 1400 is configured to store data associated with the blower 108, such as previously analyzed motor current data. The processing module 1400 retrieves an average daily motor current draw corresponding to one or more previous calendar days. The previous calendar day may be, for example, a previous consecutive day (i.e., the day before), the same day in a previous week, the same calendar day in a previous month, and so on.

The processing module 1400 may determine whether the average daily motor current data corresponding to the current draw of the blower 108 has been greater than the predetermined threshold for more than a predetermined number of consecutive days for an ECM motor or less than the predetermined threshold for more than a predetermined number of consecutive days for a PSC motor. The predetermined number of consecutive days may be, for example only, two days. When the processing module 1400 determines that the current draw has not been greater or less than the predetermined threshold, as appropriate, for more than the predetermined number of consecutive days, the processing module 1400 may store the current draw data for future reference without generating an alert.

Figure 6:
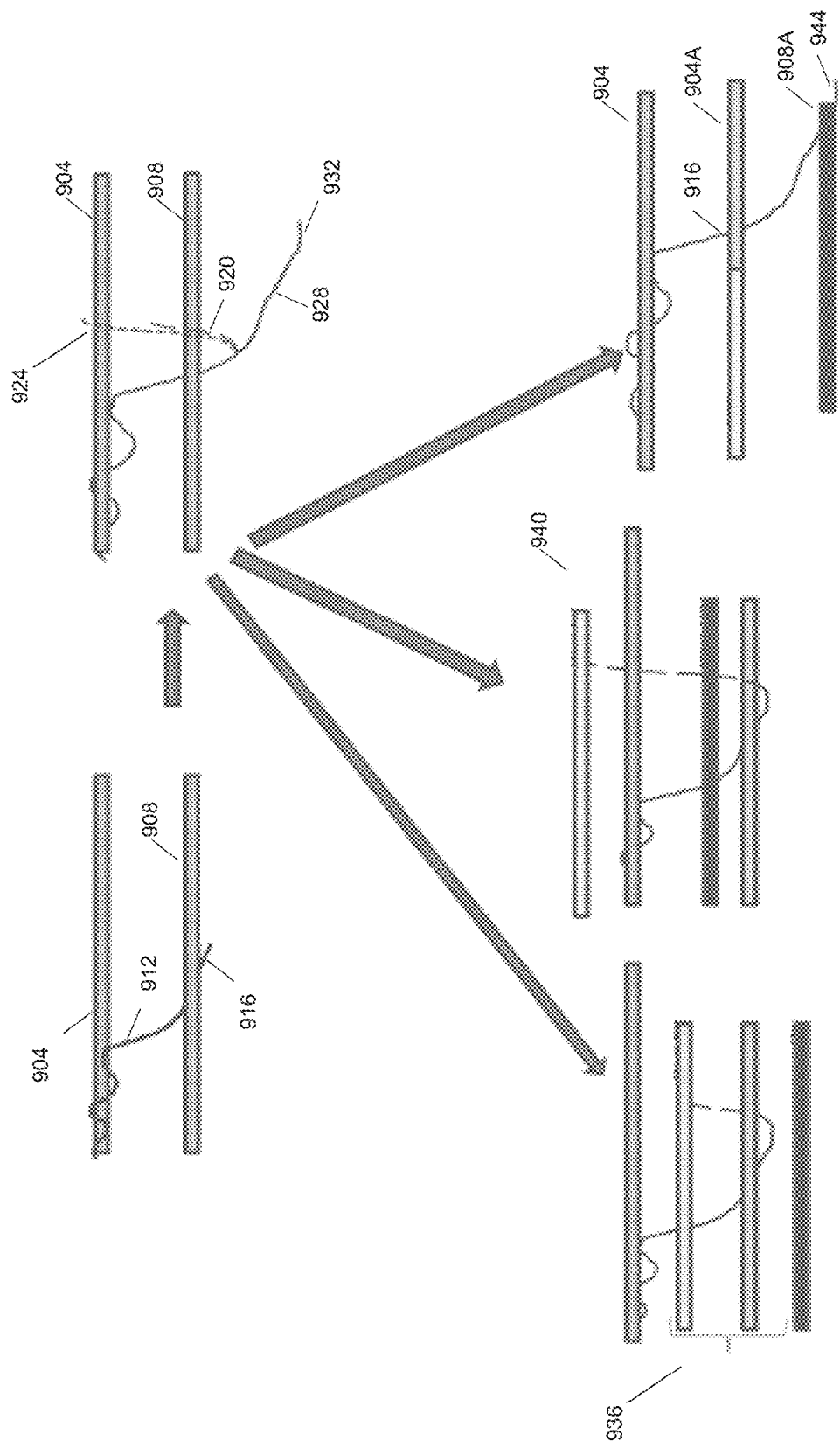
FIG. 6 is a graphical representation of current data associated with dynamic baseline threshold reestablishment.
Figure 8:
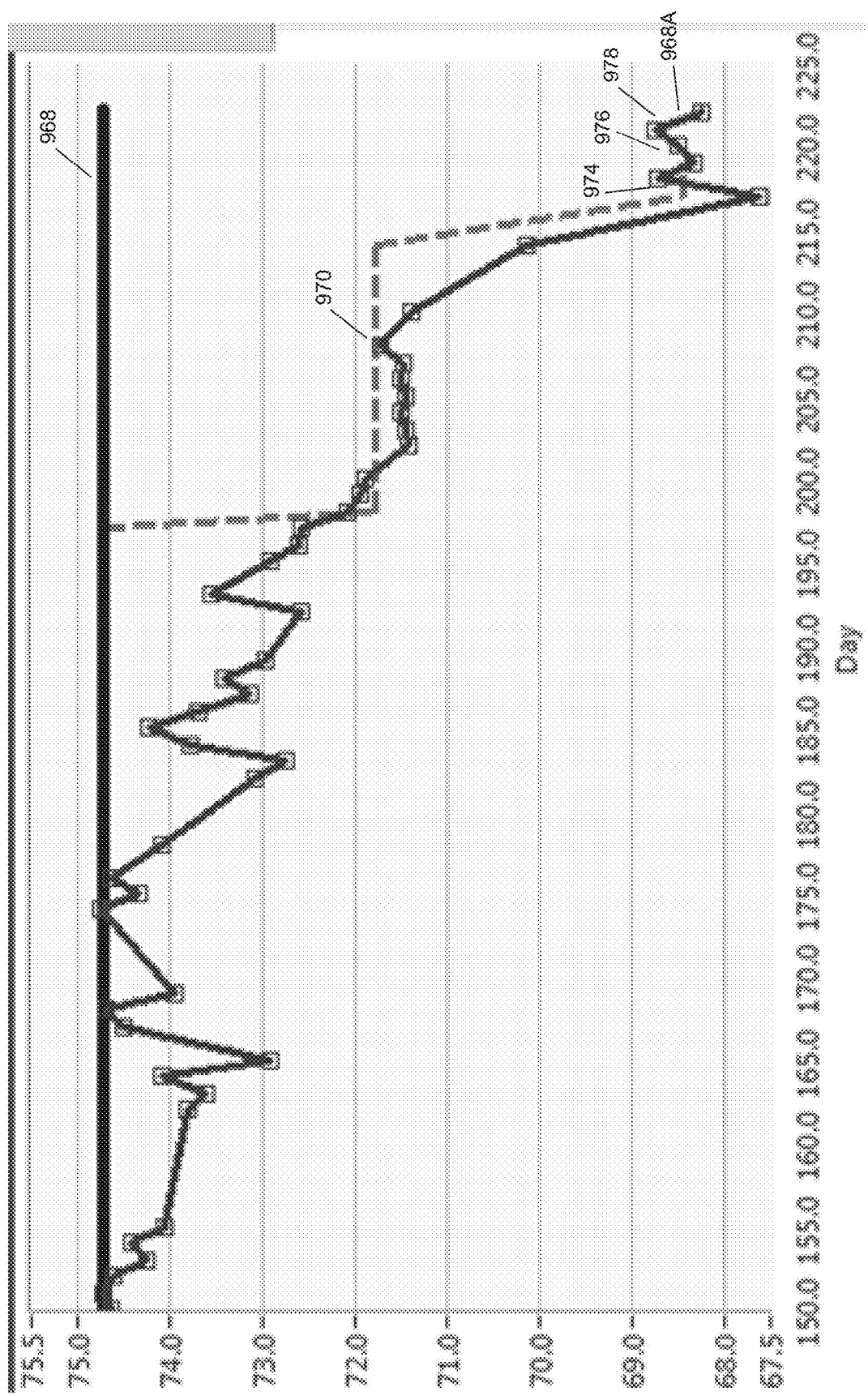
FIG. 8 is graphical representation of current data associated with dynamic baseline threshold reestablishment based on not changing a filter.

Conversely, when the processing module 1400 determines that the current data has been greater than, or less than, the predetermined threshold, as appropriate, for more than two consecutive days, the processing module 1400 generates the alert as described above. As illustrated in FIG. 6, a first baseline current draw 904 and a corresponding first predetermined threshold 908 are shown for an example PSC motor. While FIG. 8 illustrates current draw data decreasing, for example, as is expected when the blower 108 comprises a PSC motor, as described above, the principles described relating to the blower 108 comprising a constant torque ECM motor (i.e., analyzing increases in current draw) would merely be the mirror image of FIG. 6's illustrative example, with the first predetermined threshold 908 being above first baseline current draw 904 and the current draw generally increasing over time instead of decreasing. At 912, the current draw is below the baseline current draw 904, however, the current draw is not below the first predetermined threshold 908.

At 912, the processing module 1400 may store the current draw data. At 916, the current draw is below the first predetermined threshold 908 for more than the predetermined time period, for example, a predetermined consecutive number of days. At 916, the processing module 1400 may generate an alert instructing the customer to replace the filter 104. At 920, the current draw data indicates that the customer replaced the filter 104, as reflected by the general decrease in the current draw followed by a sudden increase in the current draw, with the sudden increase in current draw corresponding to the point in time where the customer replaced the filter 104 in an HVAC system with a PSC motor. Further, data subsequent to 920 indicates the blower 108 is operating within normal parameters. In other words, the replacement filter may have restriction qualities similar to or higher than the original filter. At 924, the current draw data is shown increasing beyond the baseline 904. This may indicate that the customer replaced the filter 104 with a less restrictive air filter. At 928, as an alternative example, the current draw data indicates that the customer did not replace the filter 104 or that a replacement filter is faulty or buckled. At 932, the current draw data indicates continued degraded performance of the air filter.

In some implementations, the processing module 1400 is configured to adaptively adjust the baseline. As described above, the baseline current draw corresponds to an expected average motor current draw for the circulating blower 108 and may be a predetermined baseline based on the expected average. As with many electrical systems, such as the HVAC system, components operate within an acceptable tolerance. By way of non-limiting example only, the circulator blower 108 may be said to be operating within tolerance when an actual current draw is 5% more or less than the expected baseline current draw. Similarly, each subcomponent of the circulator blower 108 also operates within an acceptable tolerance. As can be appreciated, because each of these subcomponents may operate at slightly more or less than the expected value, the aggregate effect on the blower 108 may be to operate constantly at a value different than the baseline current draw.

The processing module 1400 receives average daily motor current draw data corresponding to the measured current draw of the blower 108 over time. The processing module 1400 is configured to analyze the average daily motor current data over a predetermined period. In one example, when the HVAC system is initially installed, the processing module 1400 may receive a baseline current draw associated with the blower 108 based on the type, make, model, and installation of the blower 108 within the HVAC system. Alternatively, the processing module 1400 may learn a baseline current draw within a period of time following the install of the HVAC system as described above. The processing module 1400 may be configured to use this received value as the baseline current draw during an initial time period, such as the first month that the HVAC system is in operation.

At the end of the initial time period of operation, the processing module 1400 analyzes the received motor current draw data corresponding to the measured current draw of the circulator blower 108 over time. The processing module 1400 determines whether the motor current draw data trend is greater than or less than the baseline current draw. When the processing module 1400 determines the measured motor current trend is different than the baseline current draw, the processing module 1400 may replace the baseline current draw based on the measured motor current trend. For example, the new baseline current draw may correspond to an average motor current draw over the initial time period.

In other words, the processing module 1400 may adjust the predetermined baseline current based on actual measured performance of the blower 108 to be, for example, equal to the current average motor current draw over the initial time period. In this manner, the processing module 1400 determines a baseline current draw based on an actual performance rather than an expected performance. It is understood that the processing module 1400 may adjust the baseline current draw in response to a trend analysis of measured current draw data over any period of time, including but not limited to, a day, a week, a month, a year, and so on.

Further, while analyzing the HVAC system in the first month of operation is described, the processing module 1400 may be configured to periodically re-establish the baseline current draw. In some implementations, the processing module 1400 may annually compare a trend analysis of measured motor current data to a baseline and adjust the baseline in response to the comparison. In this manner, the processing module 1400 may account for normal degradation of the blower 108 over time. As described above, the initial baseline may be learned during a period following installation of the HVAC system.

In another implementation, the processing module 1400 may adjust the baseline current draw in response to a sudden change in the motor current draw data, where the sudden change in motor current draw data indicates a change in the opposite direction of a current draw change indicative of particulate build up on the filter 108. For example, in the case of an ECM motor, an increase in current draw may be indicative of particulate build up on the filter 104 (i.e., the filter is dirty). Conversely, a sudden decrease in current draw is not indicative of particulate build up on the filter 104. It can be appreciated that the opposite is true for a PSC motor.

The processing module 1400 compares a first average daily motor current draw to a second average daily motor current draw. In one example, the processing module 1400 subtracts the absolute value of the first motor current draw from the absolute value of the second motor current draw. In other words, the processing module 1400 determines a rate of change between daily averages of the current draw by the blower 108. The processing module 1400 determines whether the rate of change is greater than a rate of change threshold. When the processing module 1400 determines the rate of change is not greater than the rate of change threshold, the processing module 1400 stores the data. When the processing module 1400 determines the rate of change is greater than the rate of change threshold, the processing module 1400 adjusts the baseline. In some implementations, the processing module 1400 adjusts the baseline to be equal to the measured daily average motor current. In other words, the processing module 1400 adjusts the baseline to equal the new expected current draw of the blower 108. As can be appreciated, the blower 108 may increase or decrease expected current draw for various reasons, including, but not limited to, a part replacement in the HVAC system, adjustable settings being reconfigured, and or the blower 108 itself being replaced.

In another implementation, the processing module 1400 may adjust the baseline current draw based on a density of a replacement filter 104. For example, the customer may replace a dirty filter 104 with a more restrictive or less restrictive filter 104. As can be appreciated, a more restrictive filter 104 may cause the circulator blower 108 to draw a different amount of current than a less restrictive air filter. As illustrated in FIG. 6 at 936, the baseline current draw and predetermined threshold are shifted to accommodate a more restrictive air filter.

Similarly, at 940, the baseline current draw and predetermined threshold are shifted to accommodate a less restrictive filter 104. The processing module 1400 may determine a filter 104 was replaced with a more or less restrictive filter 104 based on a trend analysis of measured motor current draw data (similar to that described above with respect to the processing module 1400 adjusting the baseline in response to actual circulator blower 108 performance). Further, the processing module 1400 may receive input from the customer indicating the customer replaced the air filter with a more or less restrictive air filter. For example, the customer may input, via the customer device 324, the type of filter the customer used. Similarly, a contractor may input, via the contractor device 320, a type of filter the contractor used to replace a dirty air filter.

Figure 7:
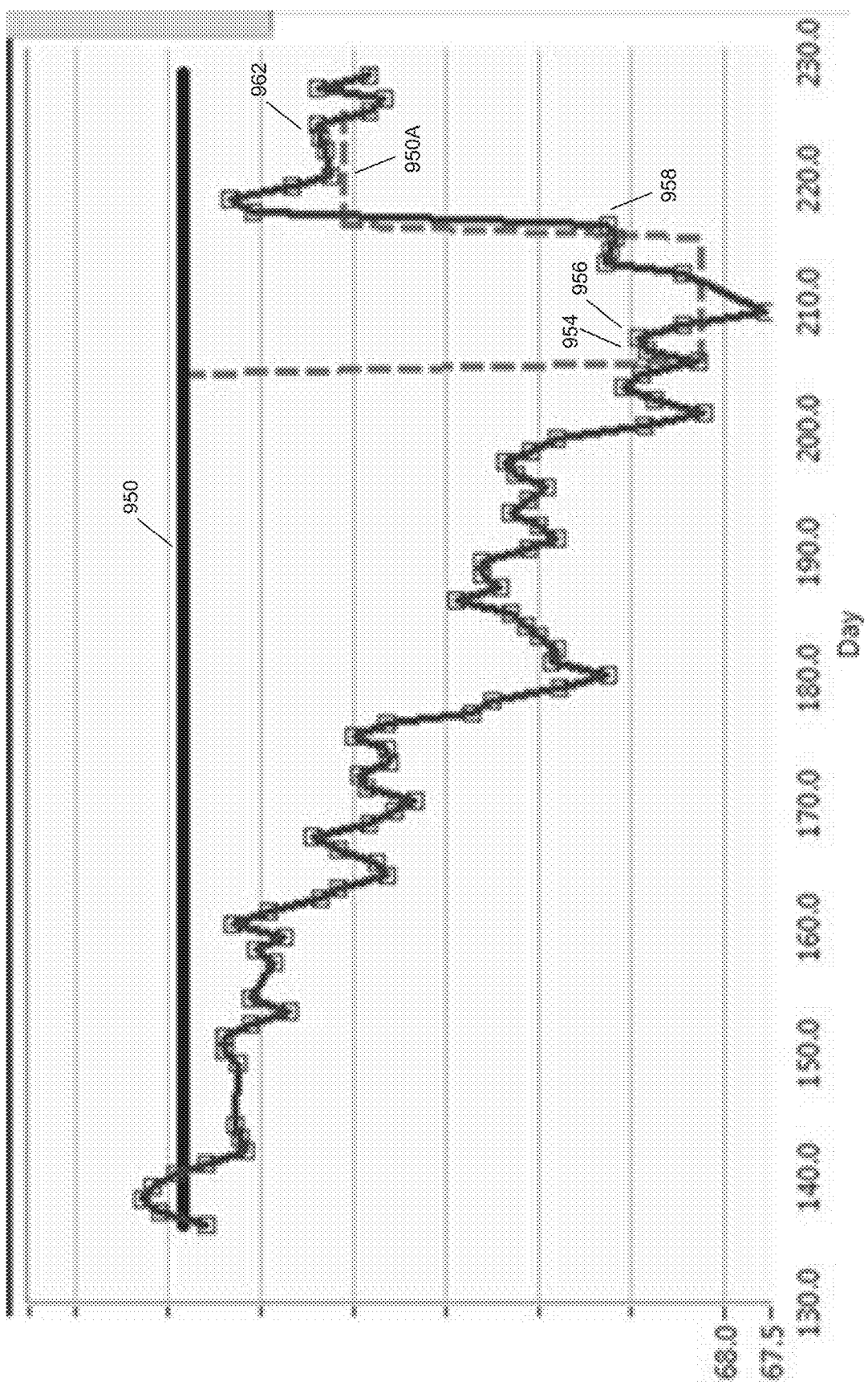
FIG. 7 is a graphical representation of current data associated with dynamic baseline threshold reestablishment based on a filter change.

As illustrated in FIG. 7, a baseline current draw 950, corresponding to a PSC motor, is adjusted to 950a in response to the customer replacing a filter 104 with a more restrictive filter 104. At 954, the processing module 1400 determines that the current draw data is below the predetermined threshold for the predetermined consecutive number of days. At 956, the processing module 1400 generates an alert instructing the customer to replace the filter 104. At 958, the customer replaces the filter 104 with a more restrictive filter 104. At 962, the processing module 1400 determines, after the predetermined consecutive number of days, that the customer replaced the filter 104 with a more restrictive filter 104. The processing module 1400 adjusts the baseline 950 to be equal to a new baseline at 950a.

In yet another implementation, the processing module 1400 adjusts the baseline in response to the customer not replacing a dirty air filter. For example, as described above, the processing module 1400 may generate an alert instructing the customer to replace a filter 104 within the HVAC system based on a determination that the filter 104 is dirty. The processing module 1400 continues to analyze motor current draw data corresponding to the circulator blower 108.

The processing module 1400 determines whether the current draw data is greater than the threshold. When the processing module 1400 determines that the current draw data is greater than the predetermined threshold, in the case of a constant torque ECM motor, or less than the predetermined threshold, in the case of a PSC motor, and the processing module 1400 has previously generated an alert, the processing module 1400 stores the data. The processing module 1400 continues to monitor the current draw data.

When the processing module 1400 determines the current draw data is greater than the predetermined threshold, in the case of a constant torque ECM motor, or less than the predetermined threshold, in the case of a PSC motor, for a predetermined consecutive number of days and the processing module 1400 has previously generated the alert, the processing module 1400 adjusts the baseline and threshold, such that the baseline current draw is set equal to the previous predetermined threshold and a new predetermined threshold is then set based on the new baseline current draw. In this way, in the event the customer ignores an initial alert to change a dirty filter 104, a new baseline current draw and predetermined threshold are set.

The processing module 1400 continues to monitor the current draw data. When the processing module 1400 determines that the current data is greater than the new adjusted threshold, in the case of a constant torque ECM motor, or less than the new adjusted threshold, in the case of a PSC motor, for the predetermined consecutive number of days, the processing module 1400 generates a severe alert and instructs the customer to replace the filter 104. In other words, when the customer does not respond to an initial alert instructing the customer to replace the filter 104, the processing module 1400 will generate a subsequent, more urgent, alert when the processing module 1400 determines a continued degraded performance of the filter 104 of the HVAC system. As can be appreciated, the processing module 1400 may monitor an amount of time that has passed since generating an alert instructing the customer to change the filter 104. The processing module 1400 may be configured to automatically continue to alert the customer in response to an amount of time passing after an initial alert was generated.

As illustrated in FIG. 6, the baseline current draw 904 is adjusted to be equal to the previous predetermined threshold at 904a with a corresponding adjusted predetermined threshold 908a. At 944, the processing module 1400 determines that the current draw data is below the predetermined threshold, in the case of a constant torque ECM motor, for the predetermined consecutive number of days. The processing module 1400 generates an urgent alert instructing the customer to replace the filter 104. As illustrated in FIG.

8, a baseline current draw 968 is adjusted to a new baseline current draw 970 in response to the customer not changing the filter 104. At 970, the processing module 1400 generates an alert instructing the customer to change the filter 104 and sets the baseline current draw to be equal to new baseline current draw. The processing module 1400 adjusts the predetermined threshold relative to the new baseline current draw.

At 974, the processing module 1400 determines that the current draw data is below the new predetermined threshold, in the case of a PSC motor, for the predetermined consecutive number of days. At 976, the processing module 1400 monitors received current draw data. At 978, the processing module 1400 determines that the current draw is below the predetermined threshold, in the case of a PSC motor, for the predetermined number of consecutive days and generates an urgent alert instructing the customer to replace the filter 104. The processing module 1400 adjusts the baseline to be set equal to the new baseline current draw at 968A and monitors received current draw data to determine further degradation from the new baseline.

As discussed above, the processing module 1400 may adjust the baseline current draw for various reasons. As further discussed above, the predetermined threshold may be an offset value relative to the baseline. As the processing module 1400 adjusts the baseline current draw, the predetermined threshold automatically adjusts relative to the baseline. In some implementations, the processing module 1400 may adjust the threshold independent of the baseline. For example, the processing module 1400 may be configured to monitor a total number of run-time hours of the HVAC system after the initial period or alternatively, from a time corresponding to a filter alert being sent. As the HVAC system runs, the amount of current shift due to particle buildup on the filter 104 may vary depending on the type motor and/or type of filter. In order to avoid delaying or missing filter alerts, the processing module 1400 may adjust the predetermined threshold (i.e., tighten the threshold or move the threshold closer to the baseline).

For example only, a threshold may be set within 5% of the baseline. After the HVAC system runs for 500 hours and no alert has been generated indicating the filter 104 is dirty or faulty, the threshold may be adjusted to be within 3% of the baseline. It is understood the values used in the examples are for illustrative purposes only, and any suitable values may be used depending on the characteristics of the HVAC system.

In another implementation, the processing module 1400 determines whether to adjust the predetermined threshold based on customer input. For example, as described above, the processing module 1400 generates an alert instructing the customer to replace an air filter. The customer may then interact with the customer device 324 to indicate an air filter change. Alternatively, the contractor may input information via the contractor device 328. For example, the customer may provide data indicating the actual condition of a filter 104 that was removed from the HVAC system (i.e., the air filter that the processing module 1400 determined was dirty). The customer may indicate that the filter 104 was, for example, very new, nearly new, somewhat dirty, ready to change, very dirty, extremely dirty, or overly dirty or buckled. It is understood that other descriptions or grading metrics may be used to communicate the condition of the replaced filter 104.

The processing module 1400 receives the input from the customer and may adjust the threshold based on the input. By way of non-limiting example, the processing module 1400 receives input indicating the air filter was very new. The processing module 1400 may then increase the threshold (i.e., relax the threshold) in order to delay a determination that the air filter is dirty.

In yet other implementations, the processing module 1400 may determine a rate of change of motor current draw over a predetermined period. For example, the processing module 1400 may determine a rate of change of motor current draw over a 14-day period. The processing module 1400 determines whether the rate of change is above a rate of change threshold and the direction of the change is indicative of particle accumulation on the filter 104. When the processing module 1400 determines the rate of change is above the threshold, the processing module 1400 generates the alert instructing the customer to change the filter. Conversely, when the processing module 1400 determines the rate of change is not above the threshold, the processing module 1400 stores the data.

The processing module 1400 may also use power factor, which may be calculated based on the difference in phase between voltage and current. Temperature comparison between supply air and return air may be used, for example, to verify reduced flow and eliminate other potential reasons for observed current or power changes in the circulator blower motor. The processing module 1400 may also determine when an evaporator coil is blocked due to accumulated frost. For example, the processing module 1400 uses a combination of loading and thermal data to identify the signature of a coil that is freezing or frozen. This can be performed even when there is no direct temperature measurement of the coil itself.

Often, a frozen coil is caused by a fan failure, but the fan failure itself may be detected separately. The processing module 1400 may use return air temperature, supply air temperature, liquid line in temperature, voltage, current, real power, and FFT data from both the air handler unit and the compressor condenser unit. In addition, the processing module 1400 may monitor control line status, switch statuses, compressor discharge temperature, liquid line out temperature, and ambient temperature. When a change in loading occurs that might be indicative of a clogged filter, but the change happened suddenly, a different issue may have caused the change in loading other than a clogged or dirty filter.

In FIG. 4, an aggregate current level begins at a non-zero current 1004 indicating that at least one energy-consuming component is consuming energy. A spike in current 1008 may indicate that another component is turning on. Elevated current 1012, for example, may correspond to operation of the inducer blower. This is followed by a spike 1016, which may indicate the beginning of operation of a hot surface igniter. After opening of a solenoid-operated gas valve, the hot surface igniter may turn off, which returns current to a level corresponding to the inducer blower at 1018. The current may remain approximately flat 1020 until a current ramp 1024 begins, indicating the beginning of circulator blower operation. A spike 1028 may indicate transition from starting to running of the circulator blower.

Figure 5A:
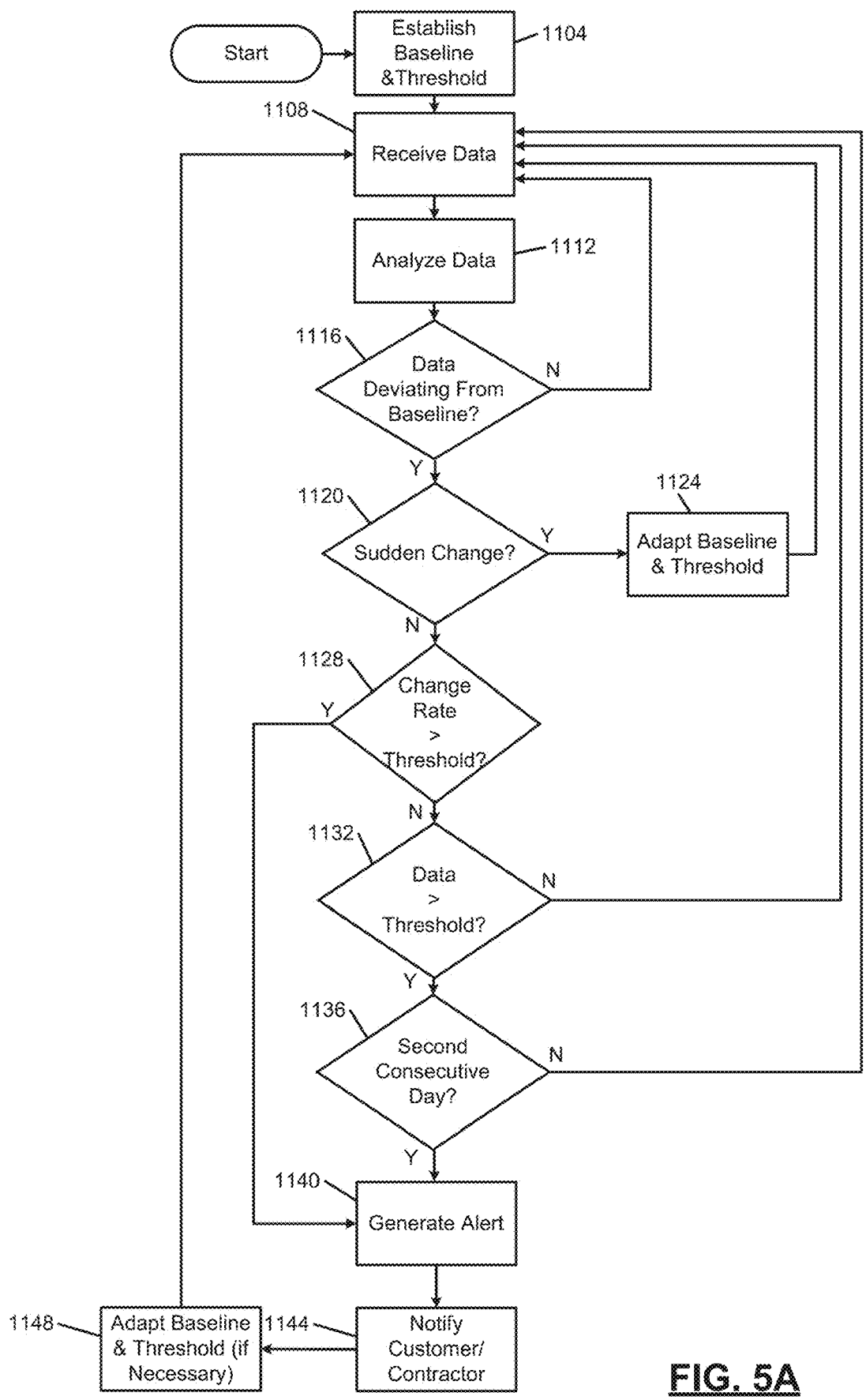
FIG. 5A is a flowchart of an example technique for diagnosing a fault in an air filter within an HVAC system.

In FIG. 5A, a technique for diagnosing a fault in an air filter within an HVAC system is shown. The technique begins at 1104, where an initial baseline and threshold are established during an initialization period. For example, current draw data is received and baseline current draw data is recorded by the processing module 1400. This may occur during the commissioning of a new monitoring system, which may be either in a new HVAC system or a retrofit installation. The current draw data is received over a predetermined initialization period of time, for example an initial 2 week period after the HVAC system is initiated or installed. During the predetermined initialization period, the current draw data is analyzed to establish an average current draw for the HVAC system.

The processing module 1400 determines an initial baseline and threshold based on the average current draw. For example only, the processing module 1400 at 1104 sets the initial baseline equal to the average current draw from the predetermined initialization period and sets the initial threshold relative to the baseline. The technique continues at 1108, where measured current draw data is received from the local devices including, for example, the condensing monitor module 316 and the air handler monitor module 322. The technique continues at 1112 where, at the remote monitoring system, the data is analyzed by the processing module 1400.

At 1116, the processing module 1400 determines whether measured current draw data deviates from the baseline. If false, the processing module 1400 returns to 1108 and continues to receive measured current draw data. If true, the processing module 1400 continues at 1120. At 1120, the processing module 1400 determines whether the deviation from the baseline was a sudden change in current draw. The processing module 1400 compares the present current draw data to a predetermined number of historical data points. By way of non-limiting example only, the processing module 1400 compares the present data to data sets received on the previous 5 consecutive days. It is understood that the processing module 1400 may be configured to compare the present data to data sets over any suitable time period.

The processing module 1400 determines a difference between the present data and each of the previously received data sets. The processing module 1400 then determines a trend corresponding to the previously received data sets and the present data. When the processing module 1400 determines a gradual change in current draw data (i.e., the previously received data and the present data indicate a gradual increase or decrease in current draw) the processing module 1400 continues at 1128.

When the processing module 1400 determines a sudden change in the present data as compared to the previously received data (i.e., the determined trend indicates a steady current draw over the previous 5 days and the present data varies from the previous 5 days) the processing module 1400 continues at 1124. It is understood that changes to components within the HVAC system may result in a change in current draw of the blower 108. For example only, the customer may change an air filter within the HVAC system.

A replacement filter may have different air restriction characteristics than that of a previously installed air filter. For example, the replacement air filter may be more or less restrictive than the previous air filter, resulting in more or less current draw by the blower 108. While only an air filter change is described, any change within the HVAC system may result in a change in current draw by the blower 108.

At 1124, the processing module 1400 adapts the baseline and threshold in response to the sudden change in current draw. For example only, the processing module 1400 may set the baseline equal to the current draw corresponding to the present data and sets the threshold relative to the adapted baseline. The processing module 1400 continues at 1108.

When at 1120 the deviation was not a sudden change in current draw, the processing module 1400 proceeds to 1128. At 1128, the processing module 1400 determines whether a rate of change of received current data is greater than a rate of change threshold and is progressing in the direction of filter developing dirt. The processing module 1400 determines a rate of change over a predetermined period. For example only, the processing module 1400 determines a rate at which the current draw is changing over the previous 5 consecutive days. It is understood the processing module 1400 may determine a rate of change over any suitable time period.

At 1128, the processing module 1400 determines whether the rate of change is in a direction that indicates particles are accumulating on the filter 104. For example, in an HVAC system including an ECM motor, an increase in current draw indicates particles are accumulating on the filter 104. When the HVAC system includes a PSC motor, a decrease in current draw indicates particles are accumulating on the filter 104. When the processing module 1400 determines at 1128 that the rate of change is not greater than the predetermined rate of change threshold, the technique continues at 1132.

At 1128 when the processing module 1400 determines the rate of change indicates particle accumulation on the filter 104, the processing module 1400 determines whether the rate of change is greater than the rate of change threshold. If false, the processing module 1400 continues at 1132. If true, the processing module 1400 continues at 1140. In other words, when the processing module 1400 determines that the received data indicates current draw by the blower 108 is changing greater than a predetermined rate and in the direction indicating particle accumulation on the filter 104, the processing module 1400 proceeds to 1140 and alerts the customer instructing the customer to change an air filter (as described below).

In this way, when the present data indicates a rate of change is greater than a rate of change threshold, an alert is generated at 1140. It is understood that the present data may be above or below the threshold relative to the baseline, however, a rate of change greater than the rate of change threshold will trigger an alert immediately. In other words, when the processing module 1400 determines the filter 104 is accumulating particles at a predetermined rate, the processing module 1400 does not wait for a number of consecutive days to pass in order to alert the customer.

At 1132, the processing module 1400 determines whether the measured current draw data (for an ECM motor) is greater than a predetermined threshold. For example, the predetermined threshold may be the initial threshold set at 1104. Alternatively, the predetermined threshold may be the adapted threshold set at 1124. In the example technique shown in FIG. 5A, the HVAC system may include an ECM motor. In other implementations the HVAC may include a PSC motor. When the HVAC system includes a PSC motor, the processing module 1400 at 1132 determines whether the present data is less than the predetermined threshold, instead of greater than.

At 1132, if false, the processing module 1400 returns to 1108. If true, the processing module 1400 continues at 1136. At 1136, the processing module 1400 determines whether the present data has been above the threshold (in the case of an ECM motor) for two or more consecutive time periods, for example two or more consecutive days. If false, the processing module 1400 returns to 1108. If true, the processing module 1400 continues at 1140.

At 1140, the processing module generates an alert instructing the customer to replace an air filter. In this way, when the present data is greater than the threshold (in the case of an ECM motor) for two or more time periods at 1136, such as two or more days, an alert is generated at 1140. At 1144, the processing module 1400 communicates the alert to the customer and/or contractor. At 1148, the processing module 1400 may adapt the baseline and threshold as described above, if necessary. For example, the processing module 1400 may tighten the threshold, by moving the threshold closer to the baseline, in response to generating the alert. The processing module then returns to 1108.

Figure 5B:
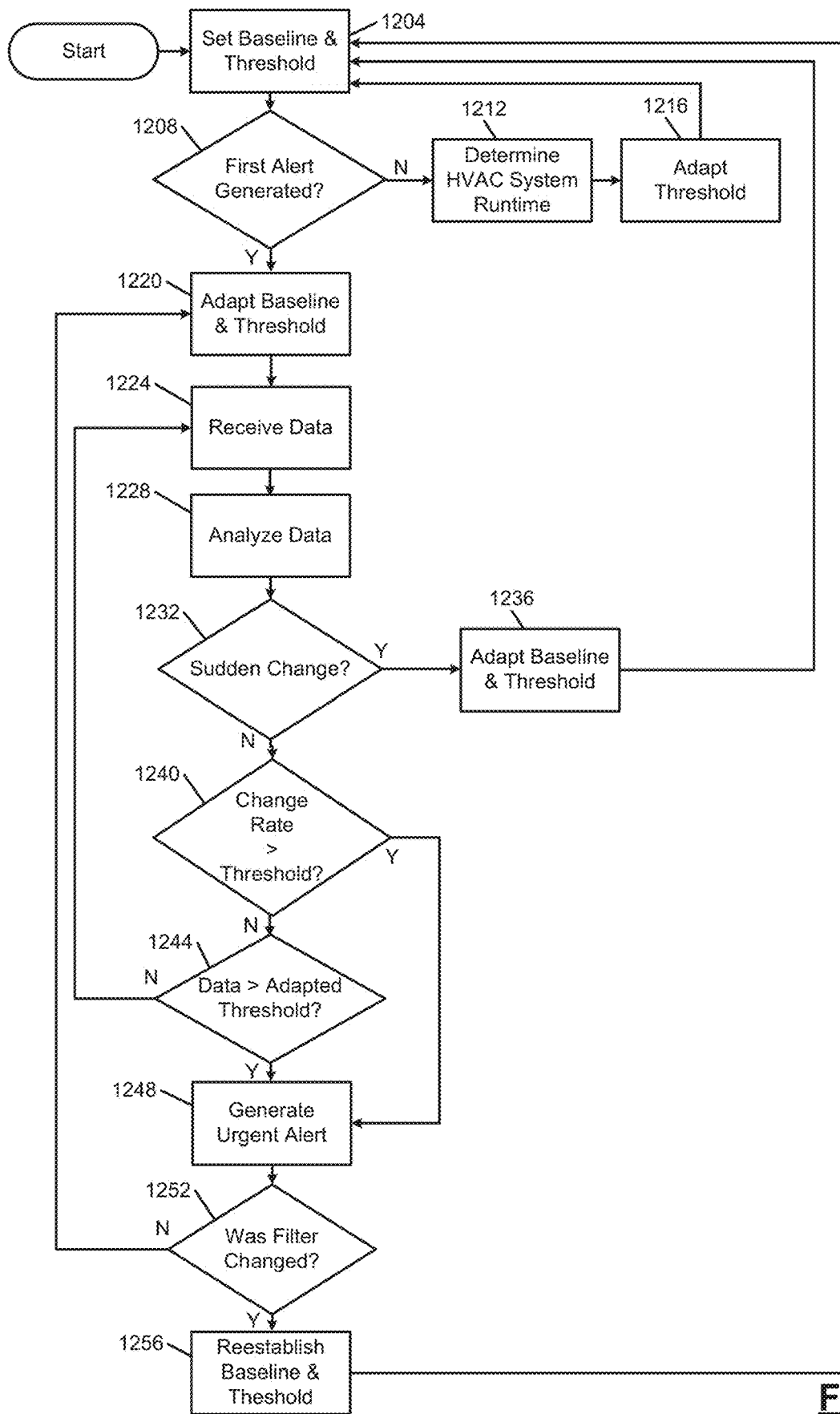
FIG. 5B is a flowchart of an example technique for adapting a current draw baseline and threshold.

In FIG. 5B, a technique for adapting a current draw baseline and threshold is shown. The technique begins at 1204, where an initial baseline and threshold are established during an initialization period. For example, current draw data is received and baseline current draw data is recorded by the processing module 1400. This may occur during the commissioning of a new monitoring system, which may be either in a new HVAC system or a retrofit installation. The current draw data is received over a predetermined initialization period of time such as, for example only, an initial 2 week period after the HVAC system is initiated or installed. During the predetermined initialization period, the current draw data is analyzed to establish an average current draw for the HVAC system.

The processing module 1400 determines an initial baseline and threshold in response to the average current draw. For example only, the processing module 1400 sets the initial baseline equal to the average current draw and sets the initial threshold relative to the baseline. At 1208, the processing module 1400 determines if a first alert instructing a customer to change an air filter was generated. If false, the technique continues at 1212. If true, the technique continues at 1220.

At 1212, the processing module 1400 determines an HVAC system runtime since the last filter change. For example, the processing module 1400 determines a period of time that has elapsed since the previous filter change. At 1216, the processing module 1400 adapts the threshold in response to the runtime. For example, as the runtime increases, the processing module 1400 may decrease a difference between the baseline and the threshold. In other words, as more time passes since the last filter change, the threshold may be modified to become closer to the baseline and, as result, the system becomes less tolerant of deviations from the baseline in current draw by the blower 108. The technique continues at 1204. At 1204, the processing module 1400 sets the threshold equal to the adapted threshold.

At 1220, the processing module 1400 adapts the baseline and threshold in response to the first alert being generated. The processing module 1400 sets the baseline to be equal to the previous threshold (i.e., the threshold used to determine whether the air filter is dirty as described above) and sets the new threshold relative to the new baseline.

At 1224 the processing module 1140 receives current draw data from the local devices such as, for example only, the condensing monitor module 204 and the air handler monitor module 200. The technique continues at 1228 where, at the remote monitoring system, the data is analyzed by the processing module 1400.

At 1232, the processing module 1400 determines whether the deviation was a sudden change in current draw, as described above with reference to reference numeral 1120 of FIG. 5A. When the processing module 1400 determines a gradual change in current draw data (i.e., the previously received data and the present data indicate a gradual increase or decrease in current draw) the processing module 1400 continues at 1240.

When the processing module 1400 determines a sudden change in the present data as compared to the previously received data (i.e., the determined trend indicates a steady current draw over the previous 5 days and the present data varies from the previous 5 days) the processing module 1400 continues at 1236. At 1236, the processing module 1400 adapts the baseline and threshold in response to the sudden change in current draw. For example only, the processing module 1400 sets the baseline equal to the current draw corresponding to the present data and sets the threshold relative to the adapted baseline. The processing module 1400 continues at 1204.

At 1240, the processing module 1400 determines whether a rate of change of received current data is greater than a rate of change threshold and is progressing in the direction of indicating particle accumulation on the filter 104, as described above with reference to reference numeral 1128 of FIG. 5A. When the processing module 1400 determines that the rate of change indicates particle accumulation on the filter 104, the processing module 1400 determines whether the rate of change is greater than the rate of change threshold. If false, the processing module 1400 continues at 1244. If true, the processing module 1400 continues at 1248.

At 1244, the processing module 1400 determines whether the received data is greater than the adapted threshold for an ECM motor. In the example technique, the HVAC system may include an ECM motor, however, in other implementations, the HVAC may include a PSC motor. When the HVAC system includes a PSC motor, the processing module 1400, at 1244, would instead determine whether the present data is less than the predetermined threshold.

At 1244, if false, the technique continues at 1224. If true, the technique continues at 1248. At 1248, the processing module 1400 generates an urgent alert. The urgent alert may instruct the customer to replace the air filter and indicate that failure to replace the air filter may result in a decrease in efficiency of the HVAC system. At 1252 the processing module 1400 determines whether the air filter was changed based on the received data. If false, the technique continues at 1220. It true, the technique continues at 1256. At 1256, the processing module 1400 reestablishes the baseline and threshold as described above.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A monitoring system for monitoring a heating, ventilation, or air conditioning (HVAC) system of a building, the monitoring system comprising:
    a monitoring server, located remotely from the building, configured to:
    (i) receive current data from a monitoring device at the building that measures a current supplied to the HVAC system,
    (ii) determine (i) an average motor current drawn by a circulator blower motor of the HVAC system over a predetermined monitoring time period based on the received current data and (ii) a rate of change of the average motor current drawn by the circulator blower of the HVAC system over the predetermined monitoring time period based on the received current data,
    (iii) determine a motor type of the circulator blower motor,
    (iv) compare (i) the average motor current drawn by the circulator blower motor with a first threshold and (ii) the rate of change of the average motor current drawn by the circulator blower motor with a second threshold,
    (v) determine whether an air filter of the HVAC system needs to be replaced based on the comparison, wherein the determination includes:
        in response to the motor type of the circulator blower motor being a first motor type, determining that the air filter of the HVAC system needs to be replaced (i) when the average motor current drawn by the circulator blower motor is greater than the first threshold for at least two consecutive days or (ii) when the rate of change of the average motor current drawn by the circulator blower motor is greater than the second threshold; and
        in response to the motor type of the circulator blower motor being a second motor type, determining that the air filter of the HVAC system needs to be replaced (i) when the average motor current drawn by the circulator blower motor is less than the first threshold for at least two consecutive days or (ii) when the rate of change of the average motor current drawn by the circulator blower motor is less than the second threshold,
    (vi) generate a notification based on the determination indicating that the air filter needs to be replaced, and
    (v) identify when the air filter is replaced to set a baseline current draw by, in response to an increase in the average motor current drawn by the circulator blower motor:
        determining a trend of the average motor current drawn by the circulator blower motor for a predetermined prior period to a start of the increase; and
        setting the baseline current draw for the circulator blower motor to a replaced filter baseline by monitoring the replaced filter baseline for a predetermined initialization time.

2. The monitoring system of claim 1 wherein the monitoring server sets the threshold relative to the baseline current draw for the circulator blower motor, the baseline current draw for the circulator blower motor corresponding to at least one of: a predetermined expected current draw for the circulator blower motor; and the average motor current drawn by the circulator blower motor over an initialization time period.

3. The monitoring system of claim 2 wherein the first motor type is an electrically commutated motor, and the threshold is set to be greater than the baseline current draw for the circulator blower motor.

4. The monitoring system of claim 3 wherein the monitoring server determines that the air filter of the HVAC system needs to be replaced when the average motor current drawn by the circulator blower motor is greater than the threshold for a predetermined time period.

5. The monitoring system of claim 2 wherein the second motor type is a permanent split capacitor motor, and the threshold is set to be less than the baseline current draw for the circulator blower motor.

6. The monitoring system of claim 5 wherein the monitoring server determines that the air filter of the HVAC system needs to be replaced when the average motor current drawn by the circulator blower motor is less than the threshold for a predetermined time period.

7. The monitoring system of claim 2 wherein the monitoring server selectively adjusts the baseline current draw based on the received current data and resets the threshold based on the adjusted baseline current draw.

8. The monitoring system of claim 7 wherein the monitoring server selectively adjusts the baseline current draw based on the determined rate of change.

9. The monitoring system of claim 1 wherein the monitoring server monitors a run-time of the HVAC system and selectively adjusts the threshold when the monitored run-time of the HVAC system is greater than a run-time threshold and the notification has not been generated during the monitored run-time of the HVAC system.

10. The monitoring system of claim 1 further comprising a review server that receives the notification from the monitoring server, outputs the notification to a technician for review, receives input from the technician verifying the notification, and generates an alert communicated to at least one of a contractor device and a customer device when the notification is verified by the technician.

11. A method for monitoring a heating, ventilation, or air conditioning (HVAC) system of a building, the method comprising:
    receiving, with a monitoring server located remotely from the building, current data from a monitoring device at the building that measures a current supplied to the HVAC system;

determining, with the monitoring server, (i) an average motor current drawn by a circulator blower motor of the HVAC system over a predetermined monitoring time period based on the received current data and (ii) a rate of change of the average motor current drawn by the circulator blower of the HVAC system over the predetermined monitoring time period based on the received current data;

determining, with the monitoring server, a motor type of the circulator blower motor;

comparing, with the monitoring server, (i) the average motor current drawn by the circulator blower motor with a first threshold and (ii) the rate of change of the average motor current drawn by the circulator blower motor with a second threshold;

determining, with the monitoring server, whether an air filter of the HVAC system needs to be replaced based on the comparison, wherein the determination includes:
  in response to the motor type of the circulator blower motor being a first motor type, determining that the air filter of the HVAC system needs to be replaced (i) when the average motor current drawn by the circulator blower motor is greater than the first threshold for at least two consecutive days or(ii) when the rate of change of the average motor current drawn by the circulator blower motor is greater than the second threshold; and
  in response to the motor type of the circulator blower motor being a second motor type, determining that the air filter of the HVAC system needs to be replaced (i) when the average motor current drawn by the circulator blower motor is less than the first threshold for at least two consecutive days or (ii) when the rate of change of the average motor current drawn by the circulator blower motor is less than the second threshold;

generating, with the monitoring server, a notification based on the determination indicating that the air filter needs to be replaced; and identifying when the air filter is replaced to set a baseline current draw by, in response to an increase in the average motor current drawn by the circulator blower motor:
  determining a trend of the average motor current drawn by the circulator blower motor for a predetermined prior period to a start of the increase; and
  setting the baseline current draw for the circulator blower motor to a replaced filter baseline by monitoring the replaced filter baseline for a predetermined initialization time.

12. The method of claim 11 further comprising:
setting, with the monitoring server, the threshold relative to the baseline current draw for the circulator blower motor, the baseline current draw for the circulator blower motor corresponding to at least one of: a predetermined expected current draw for the circulator blower motor; and the average motor current drawn by the circulator blower motor over an initialization time period.

13. The method of claim 12 wherein the first motor type is an electrically commutated motor, and the threshold is set to be greater than the baseline current draw for the circulator blower motor.

14. The method of claim 13 wherein the monitoring server determines that the air filter of the HVAC system needs to be replaced when the average motor current drawn by the circulator blower motor is greater than the threshold for a predetermined time period.

15. The method of claim 12 wherein the second motor type is a permanent split capacitor motor, and the threshold is set to be less than the baseline current draw for the circulator blower motor.

16. The method of claim 15 wherein the monitoring server determines that the air filter of the HVAC system needs to be replaced when the average motor current drawn by the circulator blower motor is less than the threshold for a predetermined time period.

17. The method of claim 12 further comprising:
selectively adjusting the baseline current draw, with the monitoring server, based on the received current data; and
resetting, with the monitoring server, the threshold based on the adjusted baseline current draw.

18. The method of claim 17 further comprising:
selectively adjusting, with the monitoring server, the baseline current draw based on the determined rate of change.

19. The method of claim 11 further comprising:
monitoring, with the monitoring server, a run-time of the HVAC system; and
selectively adjusting, with the monitoring server, the threshold when the monitored run-time of the HVAC system is greater than a run-time threshold and the notification has not been generated during the monitored run-time of the HVAC system.

20. The method of claim 11 further comprising:
receiving the notification from the monitoring server with a review server;
outputting, with the review server, the notification to a technician for review;
receiving input from the technician with the review server, for verifying the notification; and
generating, with the review server, an alert that is communicated to at least one of a contractor device and a customer device when the notification is verified by the technician.

* * * * *